United States Patent
Yasuda et al.

(10) Patent No.: US 9,550,931 B2
(45) Date of Patent: Jan. 24, 2017

(54) TEMPORARY ADHESIVE MATERIAL FOR WAFER, FILM FOR TEMPORARY ADHESION USING SAME, WAFER PROCESSING LAMINATE, AND METHOD FOR PRODUCING THIN WAFER USING SAME

(71) Applicant: SHIN-ETSU CHEMICAL CO., LTD., Tokyo (JP)

(72) Inventors: Hiroyuki Yasuda, Tomioka (JP); Michihiro Sugo, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/270,843

(22) Filed: May 6, 2014

(65) Prior Publication Data
US 2014/0342530 A1 Nov. 20, 2014

(30) Foreign Application Priority Data
May 14, 2013 (JP) .................................. 2013-101870

(51) Int. Cl.
*H01L 21/683* (2006.01)
*C09J 183/14* (2006.01)
(Continued)

(52) U.S. Cl.
CPC .......... *C09J 183/14* (2013.01); *H01L 21/6835* (2013.01); *C08G 77/14* (2013.01);
(Continued)

(58) Field of Classification Search
CPC . H01L 21/304; H01L 21/6835; H01L 27/1266
(Continued)

(56) References Cited

U.S. PATENT DOCUMENTS

| 7,541,264 B2 | 6/2009 | Gardner et al. |
| 2005/0233547 A1 | 10/2005 | Noda et al. |

(Continued)

FOREIGN PATENT DOCUMENTS

| JP | A-2004-64040 | 2/2004 |
| JP | A-2006-328104 | 12/2006 |

OTHER PUBLICATIONS

EP 2,551,322.*

*Primary Examiner* — Mohammad Islam
*Assistant Examiner* — Christina Sylvia
(74) *Attorney, Agent, or Firm* — Oliff PLC

(57) ABSTRACT

A temporary adhesive material for a wafer includes a first temporary adhesive layer of a silicone-containing polymer layer containing a photo base generator and a second temporary adhesive layer of a silicone-containing polymer layer which is laminated on the first temporary adhesive layer, does not contain the photo base generator, and is different from the polymer layer. Thereby, there can be formed a temporary adhesive layer having high thickness uniformity, even on a wafer having a step. Because of the thickness uniformity, a thin wafer having a uniform thickness of 50 μm or less can be easily obtained. When a thin wafer is produced and then delaminated from a support, the wafer can be delaminated from the support by exposure at a low exposure dose without stress. Therefore, a brittle thin wafer can be easily handled without causing damage, and a thin wafer can be easily produced.

20 Claims, 1 Drawing Sheet

(51) Int. Cl.
    *C08K 5/00*      (2006.01)
    *C08K 5/205*     (2006.01)
    *C08G 77/52*     (2006.01)
    *C08G 77/14*     (2006.01)

(52) U.S. Cl.
    CPC ............ *C08G 77/52* (2013.01); *C08K 5/0025* (2013.01); *C08K 5/205* (2013.01); *C09J 2201/134* (2013.01); *C09J 2201/36* (2013.01); *C09J 2203/326* (2013.01); *C09J 2205/102* (2013.01); *C09J 2205/31* (2013.01); *C09J 2483/00* (2013.01); *H01L 2221/6834* (2013.01); *H01L 2221/68327* (2013.01); *H01L 2221/68381* (2013.01); *Y10T 428/287* (2015.01); *Y10T 428/2852* (2015.01)

(58) Field of Classification Search
    USPC ......................................................... 438/464
    See application file for complete search history.

(56) References Cited

U.S. PATENT DOCUMENTS

| | | | |
|---|---|---|---|
| 2011/0143092 A1* | 6/2011 | Asai | C08G 77/52 428/141 |
| 2012/0213993 A1* | 8/2012 | Takeda | C08G 77/14 428/355 EP |
| 2013/0220687 A1* | 8/2013 | Tagami | C09J 7/00 174/259 |

* cited by examiner

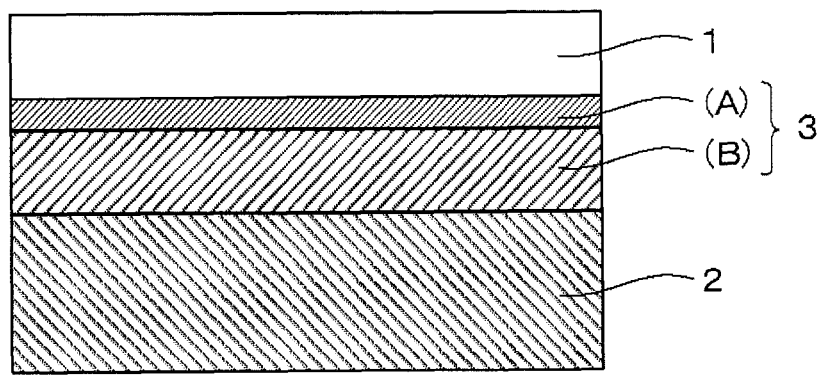

TEMPORARY ADHESIVE MATERIAL FOR WAFER, FILM FOR TEMPORARY ADHESION USING SAME, WAFER PROCESSING LAMINATE, AND METHOD FOR PRODUCING THIN WAFER USING SAME

TECHNICAL FIELD

The present invention relates to a temporary adhesive material for a wafer capable of effectively obtaining a thin wafer, a film for temporary adhesion using the same, a wafer processing laminate, and a method for producing a thin wafer.

BACKGROUND ART

Three-dimensional semiconductor mounting has become essential for further higher density, higher capacity, higher speed, and low power consumption. A three-dimensional semiconductor mounting technique is a semiconductor production technique by thinning a semiconductor chip, and connecting the chip to another chip using a through silicon via (TSV) to form a multilayer. In order to realize this technique, a step of grinding a surface without a circuit (also referred to as "back surface") of a substrate on which a semiconductor circuit is formed to thin the substrate, and forming an electrode including a TSV on the back surface is required.

Conventionally, in a step of grinding the back surface of a silicon substrate, a protective tape is attached to a surface opposite to a surface to be ground to prevent breakage of a wafer during grinding. However, in this tape, an organic resin film is used as a base material. Therefore, the tape has flexibility, but inadequate strength and heat resistance. The tape is not suited to a step of forming a TSV and a step of forming a wiring layer on a back surface.

For this reason, a system has been proposed in which a semiconductor substrate is bonded to a support of silicon, glass, or the like, through an adhesive layer to sufficiently withstand steps of grinding the back surface and forming a TSV and an electrode on the back surface. In this system, the adhesive layer used in bonding the substrate to the support is important. The substrate can be bonded to the support without gaps using the adhesive layer, and the adhesive layer needs durability enough to withstand a latter step. Further, it is necessary that a thin wafer be easily delaminated from the support finally. The adhesive layer is referred herein to as "temporary adhesive layer" since it is finally delaminated.

As known temporary adhesive layer and delaminating method, a technique in which a silicone pressure sensitive adhesive is used for a temporary adhesive layer (PATENT LITERATURE 1), and a technique in which bonding and delaminating is carried out using a heat-melting hydrocarbon-based compound for an adhesive material in a heat molten state (PATENT LITERATURE 2) have been proposed. In the former technique, a substrate is bonded to a support using an addition-curable silicone pressure sensitive adhesive, and during delaminating, the substrate is immersed in a chemical agent which is capable of dissolving or decomposing a silicone resin, and then detached from the support. This technique requires a very long time for delaminating, so that application of this technique to an actual production process is difficult. The latter technique is simple because of control only by heating, but does not have sufficient heat stability at a high temperature higher than 200° C. Therefore, the applicable range is narrow.

Further, a technique in which an adhesive material containing a light-absorbing substance is irradiated with high-intensity light to decompose a temporary adhesive layer, and as a result, a thin wafer is delaminated from a support has been proposed (PATENT LITERATURE 3). This technique requires an expensive apparatus such as a laser, and also suffers from a problem in which a processing time per substrate is extended.

CITATION LIST

Patent Literature

PATENT LITERATURE 1: U.S. Pat. No. 7,541,264
PATENT LITERATURE 2: Japanese Patent Laid-Open Publication No. 2006-328104
PATENT LITERATURE 3: Japanese Patent Laid-Open Publication No. 2004-64040

SUMMARY OF THE INVENTION

Technical Problem

The present invention is made in view of the above situation, and has an object to provide a temporary adhesive material for a wafer which facilitates temporary adhesion between a wafer and a support, allows a film with a uniform thickness to be formed on a substrate having a large difference in level, is highly compatible with steps of forming a TSV and forming a wiring on the back surface of the wafer, allows a thin wafer and a support to be easily delaminated, and is capable of increasing productivity, a film for temporary adhesion, and a method for producing a thin wafer using the same.

Solution to Problem

In order to solve the above-described problems, the present invention provides a temporary adhesive material for a wafer including a first temporary adhesive layer of a silicone-containing polymer layer (A) containing a photo base generator and a second temporary adhesive layer of a silicone-containing polymer layer (B) which is laminated on the first temporary adhesive layer, does not contain the photo base generator, and is different from the polymer layer (A).

By using such a temporary adhesive material for a wafer, temporary adhesion between a wafer and a support is facilitated, a film with a uniform thickness can be formed on a substrate having a large difference in level, compatibility with steps of forming a TSV and forming a wiring on the back surface of the wafer is high, further a thin wafer and a support are easily delaminated by decomposition of a photo base generator by exposure at a low exposure dose, and productivity can be increased.

It is preferable that the polymer layer (A) contain a thermosetting modified siloxane polymer including a silphenylene-containing polymer compound which has a weight average molecular weight of 3,000 to 500,000 and a repeating unit represented by the following general formula (1):

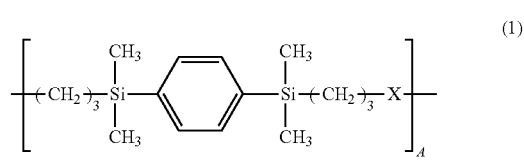

-continued

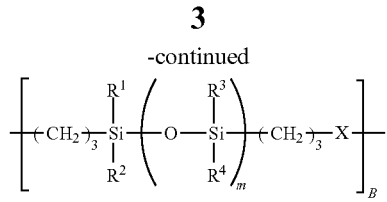

wherein, $R^1$ to $R^4$ may be the same or different, and represent a monovalent hydrocarbon group having 1 to 8 carbon atoms; "m" represents an integer of 1 to 100; A represents a positive number; B represents 0 or a positive number; A+B=1; and X represents a divalent organic group represented by the following general formula (3):

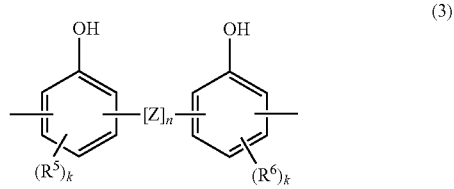
(3)

wherein, Z represents a divalent organic group selected from any of

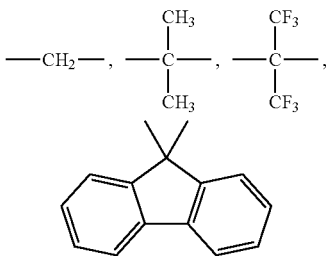

"n" represents 0 or 1; $R^5$ and $R^6$ each represent an alkyl or alkoxy group having 1 to 4 carbon atoms, and may be the same or different from each other; and "k" represents any one of 0, 1, and 2, or an epoxy-containing silicone polymer compound which has a weight average molecular weight of 3,000 to 500,000 and a repeating unit represented by the following general formula (2):

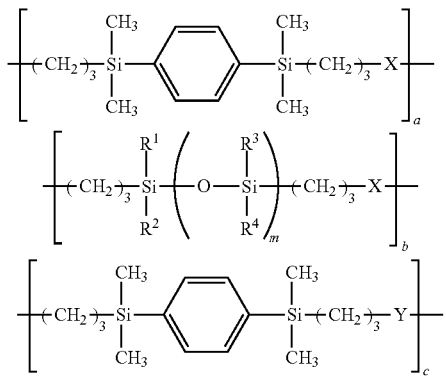
(2)

-continued

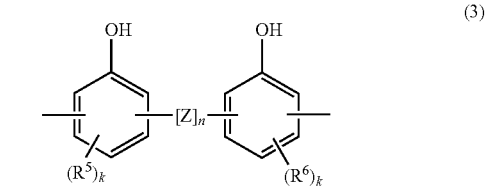

wherein, $R^1$ to $R^4$ may be the same or different, and represent a monovalent hydrocarbon group having 1 to 8 carbon atoms; "m" represents an integer of 1 to 100; "a", "b", "c", and "d" each represent 0 or a positive number; and a+b+c+d=1, provided that "c" and "d" are not 0 at the same time, and 0<(c+d)/(a+b+c+d)≤1.0; X represents a divalent organic group represents by the following general formula (3),

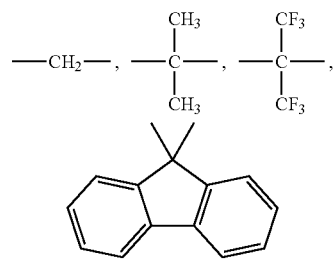
(3)

wherein, Z represents a divalent organic group selected from any of

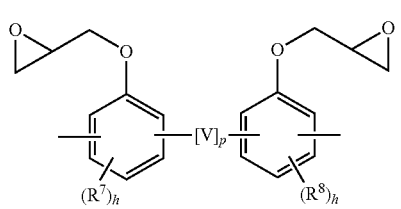

"n" represents 0 or 1; $R^5$ and $R^6$ each represent an alkyl or alkoxy group having 1 to 4 carbon atoms, and may be the same or different from each other; and "k" represents any one of 0, 1, and 2, and Y represents a divalent organic group represents by the following general formula (4):

(4)

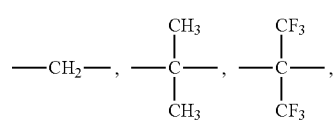

wherein, V represents a divalent organic group selected from any of

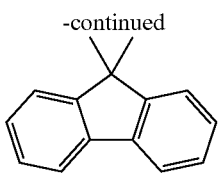

"p" represents 0 or 1; $R^7$ and $R^8$ each represent an alkyl or alkoxy group having 1 to 4 carbon atoms, and may be the same or different from each other; and "h" represents any one of 0, 1, and 2.

It is preferable that the first temporary adhesive layer consist of such a polymer layer (A) since the first temporary adhesive layer has further excellent heat resistance and good thickness uniformity.

It is preferable that the polymer layer (A) be a cured layer of a composition containing a thermosetting modified siloxane polymer including a silphenylene-containing polymer compound which has a weight average molecular weight of 3,000 to 500,000 and a repeating unit represented by the following general formula (1):

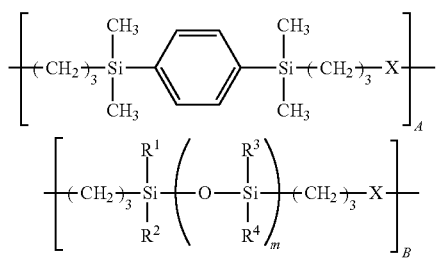

wherein, $R^1$ to $R^4$ may be the same or different, and represent a monovalent hydrocarbon group having 1 to 8 carbon atoms; "m" represents an integer of 1 to 100; A represents a positive number; B represents 0 or a positive number; A+B=1; and X represents a divalent organic group represented by the following general formula (3):

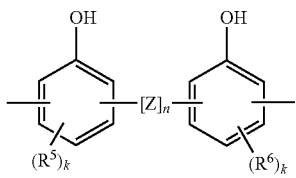

wherein, Z represents a divalent organic group selected from any of

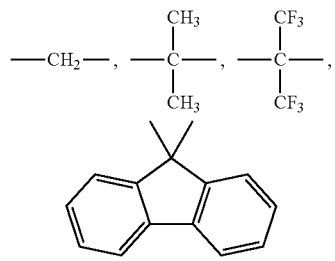

"n" represents 0 or 1; $R^5$ and $R^6$ each represent an alkyl or alkoxy group having 1 to 4 carbon atoms, and may be the same or different from each other; and "k" represents any one of 0, 1, and 2, or an epoxy-containing silicone polymer compound which has a weight average molecular weight of 3,000 to 500,000 and a repeating unit represented by the following general formula (2):

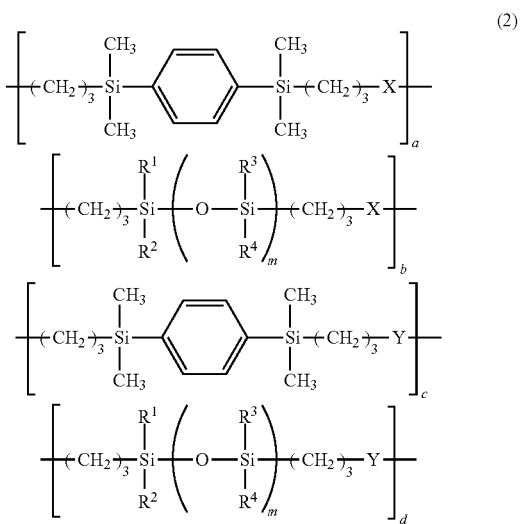

wherein, $R^1$ to $R^4$ may be the same or different, and represent a monovalent hydrocarbon group having 1 to 8 carbon atoms; "m" represents an integer of 1 to 100; "a", "b", "c", and "d" each represent 0 or a positive number; and a+b+c+d=1, provided that "c" and "d" are not 0 at the same time, and 0<(c+d)/(a+b+c+d)≤1.0; X represents a divalent organic group represents by the following general formula (3),

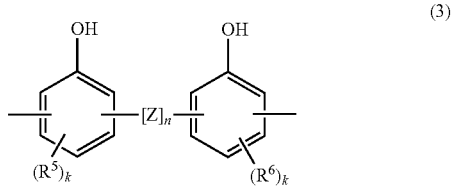

wherein, Z represents a divalent organic group selected from any of

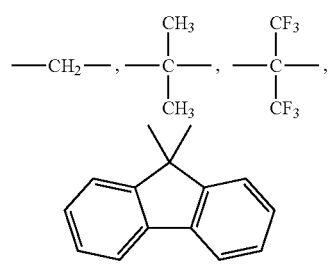

"n" represents 0 or 1; $R^5$ and $R^6$ each represent an alkyl or alkoxy group having 1 to 4 carbon atoms, and may be the same or different from each other; and "k" represents any one of 0, 1, and 2, and Y represents a divalent organic group represents by the following general formula (4):

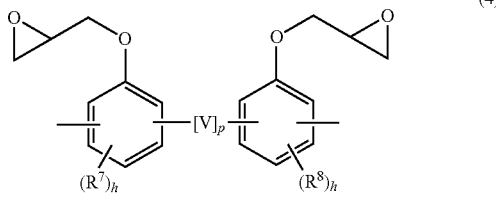

(4)

wherein, V represents a divalent organic group selected from any of

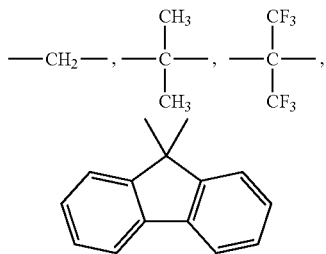

"p" represents 0 or 1; $R^7$ and $R^8$ each represent an alkyl or alkoxy group having 1 to 4 carbon atoms, and may be the same or different from each other; and "h" represents any one of 0, 1, and 2, a photo base generator, further a thermal acid generator, and any one or more cross-linking agents selected from a phenol compound having two or more methylol groups or alkoxymethylol groups on average per molecule, or an epoxy compound having two or more epoxy groups on average per molecule.

It is preferable that the first temporary adhesive layer consist of such a polymer layer (A) since the first temporary adhesive layer has further excellent heat resistance and good thickness uniformity.

It is preferable that a polymer in the polymer layer (B) be a non-aromatic saturated hydrocarbon group-containing organopolysiloxane containing the following units (I) to (III):
(I) a siloxane unit represented by $R^9SiO_{3/2}$ (T unit): 50 to 99 mol %;
(II) a siloxane unit represented by $R^{10}R^{11}SiO_{2/2}$ (D unit): 0 to 49 mol %; and
(III) a siloxane unit represented by $R^{12}_3SiO_{1/2}$ (M unit): 1 to 15 mol %,
wherein, $R^9$ to $R^{12}$ represent a monovalent organic group, 50 to 80 mol % of all the organic groups represented by $R^9$ to $R^{11}$ represent the same or different non-aromatic saturated hydrocarbon groups having the following cyclic structures having 5 to 7 carbon atoms:

10 to 40 mol % of the organic groups represent the same or different substituted or unsubstituted monovalent acyclic saturated hydrocarbon groups having 6 to 15 carbon atoms, and groups other than the cyclic and acyclic saturated hydrocarbon groups in all the organic groups represented by $R^9$ to $R^{12}$ represent the same or different substituted or unsubstituted monovalent hydrocarbon groups having 1 to 5 carbon atoms.

It is preferable that the second temporary adhesive layer consist of such a polymer layer (B) containing organopolysiloxane since organopolysiloxane is soluble in a non-polar organic solvent, but is poorly soluble in a polar organic solvent used during applying or removing a photoresist to or from a semiconductor side of a bonded substrate, and has excellent bondability and heat resistance.

It is preferable that the polymer in the polymer layer (B) be organopolysiloxane which is obtained by a hydrosilylation reaction between an alkenyl group-containing organopolysiloxane (B') which is a non-aromatic saturated hydrocarbon group-containing organopolysiloxane containing the following units (I) to (III):
(I) a siloxane unit represented by $R^9SiO_{3/2}$ (T unit): 50 to 99 mol %;
(II) a siloxane unit represented by $R^{10}R^{11}SiO_{2/2}$ (D unit): 0 to 49 mol %; and
(III) a siloxane unit represented by $R^{12}_3SiO_{1/2}$ (M unit): 1 to 15 mol %,
wherein, $R^9$ to $R^{12}$ represent a monovalent organic group, 50 to 80 mol % of all the organic groups represented by $R^9$ to $R^{11}$ represent the same or different non-aromatic saturated hydrocarbon groups having the following cyclic structures having 5 to 7 carbon atoms:

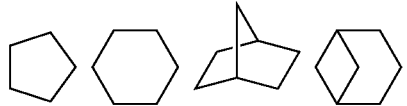

10 to 40 mol % of the organic groups represent the same or different substituted or unsubstituted monovalent acyclic saturated hydrocarbon groups having 6 to 15 carbon atoms, and groups other than the cyclic and acyclic saturated hydrocarbon groups in all the organic groups represented by $R^9$ to $R^{12}$ represent the same or different substituted or unsubstituted monovalent hydrocarbon groups having 1 to 5 carbon atoms, the alkenyl group-containing organopolysiloxane (B') in which 2 to 10 mol % of the organic groups represented by $R^9$ to $R^{12}$ are alkenyl groups having 2 to 7 carbon atoms, and an organohydrogenpolysiloxane in such an amount that the total amount of SiH groups is 0.4 to 1.0 times larger than the total amount of alkenyl groups in the alkenyl group-containing organopolysiloxane (B'), wherein the organohydrogenpolysiloxane is represented by the following general formula (5),

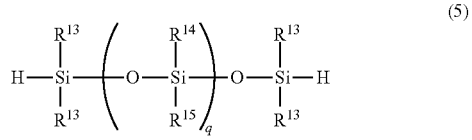

(5)

wherein, $R^{13}$ to $R^{15}$ may be the same or different, and represent a monovalent hydrocarbon group having 1 to 12 carbon atoms other than an alkenyl group; and "q" represents an integer of 0 to 100; provided that two or more kinds of different organohydrogenpolysiloxanes may be used, in the presence of a platinum group metal-based catalyst.

It is preferable that the second temporary adhesive layer consist of such a polymer layer (B) containing organopolysiloxane obtained by a hydrosilylation reaction since organopolysiloxane is soluble in a non-polar organic solvent, but is poorly soluble in a polar organic solvent used during applying or removing a photoresist to or from a semiconductor side of a bonded substrate, and has further excellent bondability and heat resistance.

It is preferable that the photo base generator in the first temporary adhesive layer be represented by the following general formula (6):

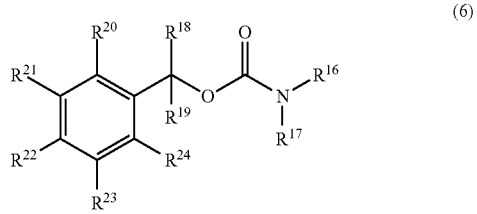

(6)

wherein, $R^{16}$ and $R^{17}$ each independently a hydrogen atom or an organic group, or $R^{16}$ and $R^{17}$ may be bonded to each other to form a nitrogen-containing aliphatic ring or a nitrogen-containing aromatic ring which has 3 to 8 carbon atoms and may have a substituent and a heteroatom, together with a nitrogen atom to which they are bonded; $R^{18}$ and $R^{19}$ each independently represent a hydrogen atom, a halogen atom, a hydroxy group, a mercapto group, a nitro group, a silyl group, a silanol group, or an organic group; $R^{20}$, $R^{21}$, $R^{22}$, $R^{23}$, and $R^{24}$ each independently represent a hydrogen atom, a halogen atom, a hydroxy group, a mercapto group, a sulfide group, a silyl group, a silanol group, a nitro group, a nitroso group, a sulfino group, a sulfo group, a sulphonato group, a phosphino group, a phosphinyl group, a phosphono group, a phosphonato group, an amino group, an ammonio group, or an organic group, and may be the same or different, or two or more of $R^{20}$, $R^{21}$, $R^{22}$, $R^{23}$, and $R^{24}$ may be bonded to each other to form a cyclic structure or have a bond to a heteroatom.

Such a photo base generator is preferable since a thin wafer and a support are easily delaminated by decomposition of the photo base generator by exposure at a low exposure dose, and productivity can be increased.

Further, the present invention provides a film for temporary adhesion having a temporary adhesive layer made of the temporary adhesive material for a wafer.

The film for temporary adhesion of the present invention has a temporary adhesive layer made of the temporary adhesive material for a wafer. Therefore, the film for temporary adhesion allows a thin wafer and a support to be easily delaminated by decomposition of a photo base generator by exposure at a low exposure dose when the wafer is delaminated from the support.

Further, the present invention provides a wafer processing laminate comprising a support, a temporary adhesive layer which comprises the temporary adhesive material for a wafer of the above-described invention formed thereon, and a wafer laminated on the temporary adhesive layer, where the wafer has a circuit-forming front surface and a back surface to be processed, wherein the first temporary adhesive layer releasably adheres to the support, and the second temporary adhesive layer releasably adheres to the front surface of the wafer.

According to such a wafer processing laminate, temporary adhesion between a wafer and a support is facilitated, a film with a uniform thickness can be formed on a substrate having a large difference in level, compatibility with steps of forming a TSV and forming a wiring on the back surface of the wafer is high, further a thin wafer and a support are easily delaminated by decomposition of a photo base generator by exposure at a low exposure dose, and productivity can be increased.

Moreover, the present invention provides a method for producing a thin wafer including: (a) a step of bonding a surface with a circuit of a wafer which has the surface with a circuit as the front surface and a surface without a circuit as the back surface to a support via the temporary adhesive material for a wafer or the temporary adhesive layer included in the film for temporary adhesion; (b) a step of grinding or polishing the surface without a circuit of the wafer bonded to the support; (c) a step of processing the surface without a circuit of the wafer; (d) a step of delaminating the processed wafer from the support by light irradiation; and (e) a step of removing a temporary adhesive material remaining on the surface with a circuit of the delaminated wafer.

According to such a method for producing a thin wafer, a temporary adhesive layer including at least two layers in the present invention is used to bond a wafer to a support. Thus, a thin wafer having a through electrode structure or a bump connection structure can be easily produced. Therefore, the method is preferable.

Advantageous Effects of Invention

Using the temporary adhesive material and the film for temporary adhesion of the present invention, a temporary adhesive layer having high thickness uniformity can be formed even on a wafer having steps. Because of the thickness uniformity, a thin wafer having a uniform thickness of 50 μm or less can be easily obtained. When a thin wafer is produced and then delaminated from a support, the wafer can be delaminated from the support by exposure at a low exposure dose without stress. Therefore, a brittle thin wafer can be easily handled without causing damage, and a thin wafer can be easily produced.

BRIEF DESCRIPTION OF DRAWINGS

FIG. 1 is a cross-sectional view illustrating one example of a wafer processing laminate using a temporary adhesive material for a wafer of the present invention.

DESCRIPTION OF EMBODIMENTS

Hereinafter, the present invention will be described in detail.

As described above, the development of the temporary adhesive material for a wafer which facilitates temporary adhesion between a wafer and a support, allows a film with a uniform thickness to be formed on a substrate having a large difference in level, is highly compatible with steps of forming a TSV and forming a wiring on the back surface of the wafer, allows a thin wafer and the support to be easily delaminated, and is capable of increasing productivity, the film for temporary adhesion, and the method for producing a thin wafer using the same has been expected.

The present inventors have intensively studied to achieve the objects. As a result, the present inventors have found that when a temporary adhesive material for a wafer including a first temporary adhesive layer of a silicone-containing polymer layer (A) containing a photo base generator and a second temporary adhesive layer of a silicone-containing polymer layer (B) which is laminated on the first temporary adhesive layer, does not contain the photo base generator, and is different from the polymer layer (A) is used to bond a wafer to a support, a thin wafer having a through electrode structure or a bump connection structure can be delaminated without stress, and further found a method for simply producing the thin wafer. The present invention has been completed.

Hereinafter, the present invention will be described in detail, but the present invention is not limited to these.

For a polymer in the polymer layer (A), a thermosetting modified siloxane polymer represented by the following general formula (1) or (2) can be used.

Polymer Represented by General Formula (1):

A silphenylene-containing polymer compound which has a weight average molecular weight of 3,000 to 500,000 and a repeating unit represented by the following general formula (1):

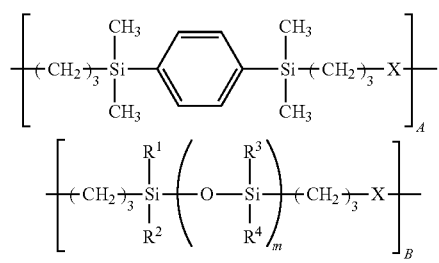

wherein, R' to $R^4$ may be the same or different, and represent a monovalent hydrocarbon group having 1 to 8 carbon atoms; "m" represents an integer of 1 to 100; A represents a positive number; B represents 0 or a positive number; A+B=1; and X represents a divalent organic group represented by the following general formula (3):

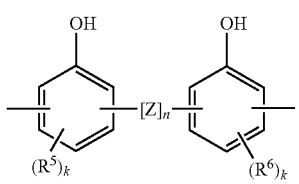

wherein, Z represents a divalent organic group selected from any of

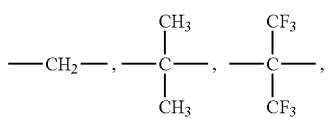

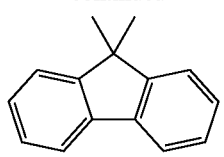

"n" represents 0 or 1; $R^5$ and $R^6$ each represent an alkyl or alkoxy group having 1 to 4 carbon atoms, and may be the same or different from each other; and "k" represents any one of 0, 1, and 2.

In this case, specific examples of $R^1$ to $R^4$ include a methyl group, an ethyl group, and a phenyl group. "m" is preferably an integer of 3 to 60, and more preferably 8 to 40. B/A is 0 to 20, and especially 0.5 to 5.

Polymer Represented by General Formula (2):

An epoxy-containing silicone polymer compound which has a weight average molecular weight of 3,000 to 500,000 and a repeating unit represented by the following general formula (2):

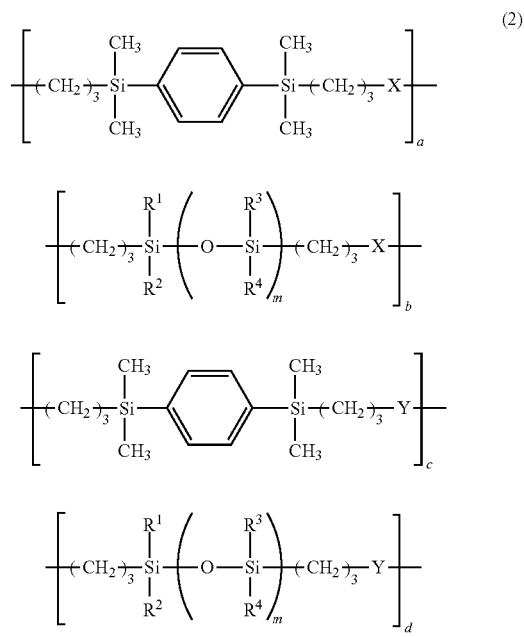

wherein, $R^1$ to $R^4$ may be the same or different, and represent a monovalent hydrocarbon group having 1 to 8 carbon atoms; "m" is an integer of 1 to 100; "a", "b", "c" and "d" are each 0 or a positive number; and a+b+c+d=1, provided that "c" and "d" are not equal to 0 at the same time, and 0<(c+d)/(a+b+c+d)≤1.0; X represents a divalent organic group represented by the following general formula (3), In this case, preferable ranges are 0<a≤0.8, 0<b≤0.8, 0≤c<0.8, 0≤d<0.8; preferably 0<a≤0.8, more preferably 0.1≤a≤0.8, particularly preferably 0.3≤a≤0.7; preferably 0<b≤0.8, more preferably 0.1≤b≤0.8, particularly preferably 0.1≤b≤0.5; preferably 0≤c≤0.5, particularly preferably 0≤c≤0.3; and preferably 0≤d≤0.5, particularly preferably 0≤d≤0.3, provided that a+b+c+d=1.

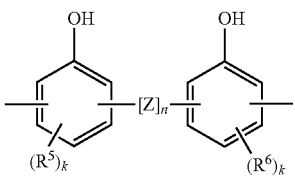

wherein, Z represents a divalent organic group selected from any of

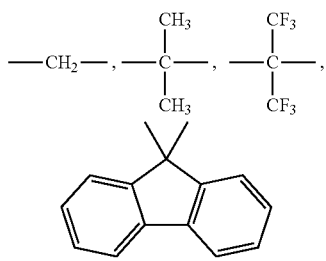

"n" represents 0 or 1; $R^5$ and $R^6$ each represent an alkyl or alkoxy group having 1 to 4 carbon atoms, and may be the same or different from each other; and "k" represents any one of 0, 1, and 2, and Y represents a divalent organic group represents by the following general formula (4),

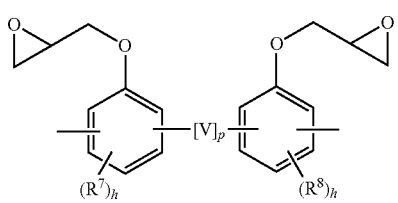

wherein, V represents a divalent organic group selected from any of

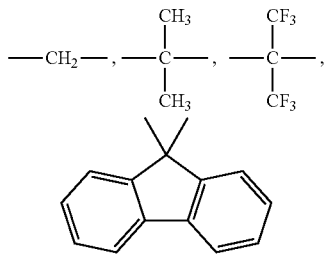

"p" represents 0 or 1; $R^7$ and $R^8$ each represent an alkyl or alkoxy group having 1 to 4 carbon atoms, and may be the same or different from each other; and "h" represents any one of 0, 1, and 2.

In this case, specific examples of $R^1$ to $R^4$ and "m" are as defined above.

It is preferable that polymer layer (A) contain a thermosetting modified siloxane polymer including a silphenylene-containing polymer compound represented by the general formula (1) or an epoxy-containing silicone polymer compound represented by the general formula (2).

A composition mainly containing a thermosetting modified siloxane polymer represented by the general formula (1) or (2) can contain a photo base generator, a thermal acid generator for heat curing, and further any one or more cross-linking agents selected from a phenol compound having two or more methylol groups or alkoxymethylol groups on average per molecule, or an epoxy compound having two or more epoxy groups on average per molecule.

Examples of a photo base generator which is contained in the first temporary adhesive layer and is decomposed by light with a wavelength of 190 to 500 nm include a compound represented by the following general formula (6),

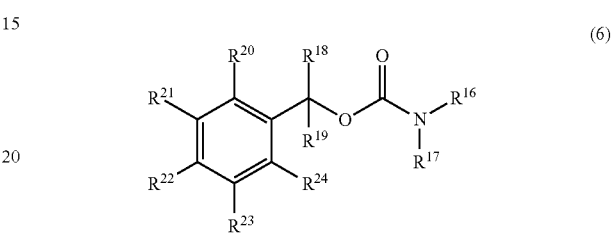

wherein, $R^{16}$ and $R^{17}$ each independently a hydrogen atom or an organic group, or $R^{16}$ and $R^{17}$ may be bonded to each other to form a nitrogen-containing aliphatic ring or a nitrogen-containing aromatic ring which has 3 to 8 carbon atoms and may have a substituent and a heteroatom, together with a nitrogen atom to which they are bonded; $R^{18}$ and $R^{19}$ each independently represent a hydrogen atom, a halogen atom, a hydroxy group, a mercapto group, a nitro group, a silyl group, a silanol group, or an organic group; $R^{20}$, $R^{21}$, $R^{22}$, $R^{23}$, and $R^{24}$ each independently represent a hydrogen atom, a halogen atom, a hydroxy group, a mercapto group, a sulfide group, a silyl group, a silanol group, a nitro group, a nitroso group, a sulfino group, a sulfo group, a sulphonato group, a phosphino group, a phosphinyl group, a phosphono group, a phosphonato group, an amino group, an ammonio group, or an organic group, and may be the same or different, or two or more of $R^{20}$, $R^{21}$, $R^{22}$, $R^{23}$, and $R^{24}$ may be bonded to each other to form a cyclic structure or have a bond to a heteroatom.

In the formula (6), examples of organic groups of $R^{16}$ to $R^{24}$ include a saturated or unsaturated alkyl group having 3 to 8 carbon atoms, a saturated or unsaturated cycloalkyl group, an aryl group, an aralkyl group, a saturated or unsaturated halogenated alkyl group, a cyano group, an isocyanato group, a cyanato group, an isocyanato group, a thiocyanato group, an isothiocyanato group, an alkoxycarbonyl group, a carbamoyl group, a thiocarbamoyl group, a carboxyl group, a carboxylate group, an acyl group, an acyloxy group, a hydroxyimino group, a saturated or unsaturated alkyl ether group, a saturated or unsaturated alkylthio group, an aryl ether group, and an arylthio group.

In $R^{16}$ and $R^{17}$, each organic group may contain a substituent, an unsaturated bond, or a bond to a heteroatom, and is preferably a linear, branched, or cyclic hydrocarbon group. Examples of a bond other than a hydrocarbon group in the organic group include an ether bond, a thioether bond, a carbonyl bond, a thiocarbonyl bond, an ester bond, an amide bond, a urethane bond, an imino bond (—N═C(—R)— or —C(═NR)—, wherein R represents a hydrogen atom or an organic group), a carbonate bond, a sulfonyl bond, a sulfinyl bond, and an azo bond. In terms of heat resistance, it is preferable that the bond other than a hydrocarbon group in the organic group be an ether bond, a thioether bond, a carbonyl bond, a thiocarbonyl bond, an ester bond, an amide bond, a urethane bond, an imino bond (—N═C(—R)— or —C(═NR)—, wherein R represents a hydrogen atom or an organic group), a carbonate bond, a sulfonyl bond, or a sulfinyl bond.

$R^{18}$ and $R^{19}$ each independently represent a hydrogen atom, a halogen atom, a hydroxy group, a mercapto group, a nitro group, a silyl group, a silanol group, or an organic group, and as the organic group, the same organic groups as exemplified below as $R^{20}$ to $R^{24}$ can be used.

Examples of organic groups in $R^{20}$ to $R^{24}$ include a saturated or unsaturated alkyl group, a saturated or unsaturated cycloalkyl group, an aryl group, an aralkyl group, and a saturated or unsaturated halogenated alkyl group. These organic groups may contain a bond and a substituent other than a hydrocarbon group, such as a heteroatom, in the group, and may be a linear, branched, or cyclic. As the bond other than a hydrocarbon group in the organic groups of $R^{20}$ to $R^{24}$, the same bonds other than a hydrocarbon group as in $R^{16}$ and $R^{17}$ can be used.

Further, the organic groups of $R^{20}$ to $R^{24}$ may be bonded to a benzene ring through a bond other than a hydrocarbon group. As the substituent other than a hydrocarbon group in the organic groups of $R^{20}$ to $R^{24}$ (which is a substituent other than a hydrocarbon group and a substituent which may be substituted by a hydrocarbon group in substituents included in the organic groups), the same substituent other than a hydrocarbon group as in $R^{16}$ and $R^{17}$ can be used.

In $R^{20}$ to $R^{24}$, each organic group is generally a monovalent organic group, but when a cyclic structure described below is formed, the organic group may be a divalent or higher organic group. Two or more of $R^{20}$ to $R^{24}$ may be bonded to form a cyclic structure.

The cyclic structure may be a structure formed by a saturated or unsaturated alicyclic hydrocarbon, a heterocyclic ring, and a fused ring, and a combination of two or more selected from the group consisting of the saturated or unsaturated alicyclic hydrocarbon, the heterocyclic ring, and the fused ring. For example, two or more of $R^{20}$ to $R^{24}$ may be bonded to each other to form a fused ring such as naphthalene, anthracene, phenanthrene, and indene, together with an atom of a benzene ring to which each of $R^{20}$ to $R^{24}$ is bonded. This case is preferred since the absorption wavelength is increased.

In the formula (6), it is preferable that $R^{20}$ to $R^{24}$ be a hydrogen atom, a halogen atom, a hydroxy group, a mercapto group, a sulfide group, a silyl group, a silanol group, a nitro group, a nitroso group, a sulfino group, a sulfo group, a sulphonato group, a phosphino group, a phosphinyl group, a phosphono group, a phosphonato group, an amino group, an ammonio group, an alkyl group having 1 to 20 carbon atoms such as a methyl group, an ethyl group, and a propyl group; a cycloalkyl group having 4 to 23 carbon atoms such as a cyclopentyl group and a cyclohexyl group; a cycloalkenyl group having 4 to 23 carbon atoms such as a cyclopentenyl group and a cyclohexenyl group; an aryloxyalkyl group (—ROAr group) having 7 to 26 carbon atoms such as a phenoxymethyl group, a 2-phenoxyethyl group, and a 4-phenoxybutyl group; an aralkyl group having 7 to 20 carbon atoms such as a benzyl group and a 3-phenylpropyl group; an alkyl group having 2 to 21 carbon atoms and a cyano group such as a cyanomethyl group and a β-cyanoethyl group; an alkyl ether group which may be substituted by an alkyl group having 1 to 20 carbon atoms and a hydroxy group such as a hydroxymethyl group, a methoxy group, an ethoxy group, or an aryl group having 1 to 20 carbon atoms such as a benzyloxy group; an aryl ether group such as a phenoxy group and a naphthyloxy group; an amido group having 2 to 21 carbon atoms such as an acetamido group and a benzenesulfonamido group ($C_6H_5SO_2NH_2$-group); an alkylthio group (—SR group) having 1 to 20 carbon atoms such as a methylthio group and an ethylthio group; an arylthio group such as a benzylthio group and a naphthylthio group; an acyl group having 1 to 20 carbon atoms such as an acetyl group and a benzoyl group; a thioacyl group; an acylthio group such as an acetylthio group and a benzoylthio group; an ester group (—COOR group and —OCOR group) having 2 to 21 carbon atoms such as a methoxycarbonyl group, an acetoxy group, and a benzyloxycarbonyl group, an aryl group having 6 to 20 carbon atoms such as a phenyl group, a naphthyl group, a biphenyl group, and a tolyl group, an aryl group having 6 to 20 carbon atoms of which an electron donating group and/or an electron withdrawing group are substituted, a benzyl group of which an electron donating group and/or an electron withdrawing group are substituted, a cyano group, a carbamoyl group, a carbamoyloxy group, a cyanooxy group (cyanato group), a cyanothio group (thiocyanato group), or a formyl group. Further, the alkyl moiety in the groups may be linear, branched, or cyclic.

Specific examples of the halogen atoms represented by $R^{20}$ to $R^{24}$ include a fluorine atom, a chlorine atom, a bromine atom, and an iodine atom. Among them, a chlorine atom and a bromine atom are preferable, and in particular, a bromine atom is more preferable.

Since the polymer in the polymer layer (A) in the present invention has thermosetting property, the photo base generator needs heat resistance. The thermogravimetric reduction ratio during measurement using a thermobalance between 100° C. and 160° C. is preferably 50% or less, more preferably 40% or less, and further preferably 30% or less. When the thermogravimetric reduction ratio is 50% or less, there is no risk of making delaminating of a supporting substrate difficult. Therefore, this is preferable.

Specific examples of the photo base generator represented by the general formula (6) include compounds represented by the following formulae (6-1) and (6-2).

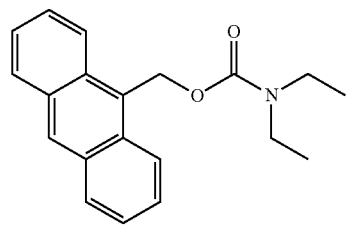
(6-1)

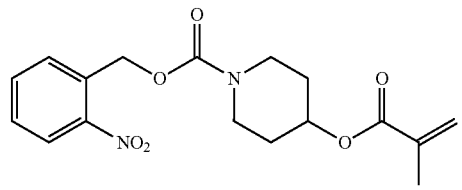
(6-2)

The amount of the photo base generator to be added is 30 to 500 μarts by mass, preferably 40 to 300 μarts by mass, and more preferably 50 to 100 μarts by mass, relative to 100 μarts by mass of the thermosetting modified siloxane polymer. A mixture of two or three or more photo base generators may be added. When the amount is 30 μarts by mass or more, the amount of photo base generator to be decomposed is sufficient, and there is no risk of making delaminating of a support difficult. Therefore, this is preferable. When the amount is 500 parts by mass or less, there is no risk of significantly decreasing the solubility of the photo base generator. Therefore, this is preferable.

A thermal acid generator which can be mixed in the polymer layer (A) is not particularly limited. The amount of a component of the thermal acid generator to be added is 0 to 10 parts by mass, preferably 0.05 to 10 parts by mass, and more preferably 0.1 to 5 parts by mass, relative to 100 parts by mass of the thermosetting modified siloxane polymer of the formula (1) or (2). When the amount is 0.05 parts by mass or more, curing sufficiently proceeds, and when the amount is 10 parts by mass or less, the compatibility is achieved during addition of an organic solvent. Therefore, this is preferable. To the thermal acid generator, a known thermal acid generator pyrolized at a temperature of 100° C. or more can be used. The thermal acid generator may be compounds such as thermal acid generators including a diazonium salt, a sulfonium salt, an iodonium salt, a sulfonyldiazomethane, or an N-sulfonyloxyimide alone or in combination.

Specific examples of the thermal acid generator include U-CAT SA102 (DBU-octanoic acid salt manufactured by San-Apro Ltd.).

As a cross-linking agent, one or more cross-linking agents selected from a phenol compound having two or more methylol groups or alkoxymethylol groups on average per molecule, or an epoxy compound having two or more epoxy groups on average per molecule can be used.

The composition may contain a difunctional, trifunctional, tetrafunctional, or higher functional cross-linking agent, particularly an epoxy resin, for example, EOCN-1020, EOCN-102S, XD-1000, NC-2000-L, EPPN-201, GAN, and NC6000, which are available from NIPPON KAYAKU Co., Ltd., and cross-linking agents represented by the following formulae.

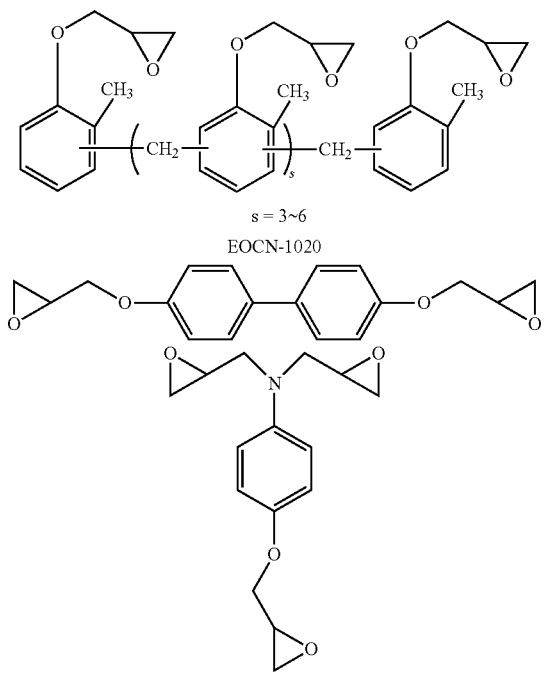

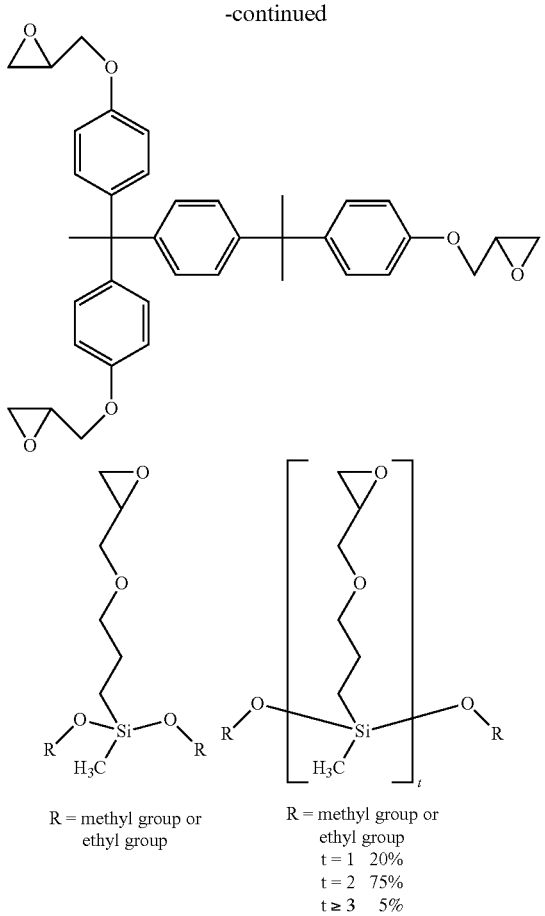

The amount of the cross-linking agent to be added is 0 to 50 parts by mass, preferably 0.1 to 50 parts by mass, more preferably 0.5 to 30 parts by mass, and particularly preferably 1 to 20 parts by mass, relative to 100 parts by mass of the thermosetting modified siloxane polymer. A mixture of two or three or more cross-linking agents may be added.

When the thermosetting modified siloxane polymer is an epoxy-containing silicone polymer compound represented by the general formula (2), examples of a cross-linking agent thereof particularly include a m,p-cresol novolac resin, for example, EP-6030G manufactured by Asahi organic chemicals industry Co., Ltd.; a trifunctional phenol compound, for example, Tris-P-PA manufactured by Honshu chemical industry Co., Ltd.; and a tetrafunctional phenol compound, for example, TEP-TPA manufactured by Asahi organic chemicals industry Co., Ltd. etc.

In this case, the amount of the cross-linking agent to be added is 0 to 50 parts by mass, preferably 0.1 to 50 parts by mass, more preferably 0.1 to 30 parts by mass, and particularly preferably 1 to 20 parts by mass, relative to 100 parts by mass of the thermosetting modified siloxane polymer. A mixture of two or three or more cross-linking agents may be added.

To the composition of the first temporary adhesive layer, a curing catalyst such as an acid anhydride may be also added.

To the composition of the first temporary adhesive layer, a known antioxidant or a filler such as silica may be added in an amount of 50 parts by mass or less, relative to 100 parts by mass of the silicone-containing polymer (A), to further enhance the heat resistance.

It is preferable that the first temporary adhesive layer be formed so that the thickness after curing is 1 to 200 μm, and preferably 5 to 100 μm. When the thickness is 1 μm or more, the amount of the photo base generator to be decomposed is not insufficient, and there is no risk of making delaminating of a support difficult. Therefore, this is preferable. When the thickness is 200 μm or less, a resin is not deformed in a heat treatment step such as a step of forming a TSV, and the first temporary adhesive layer can be applied to practical use.

Organopolysiloxane which is the polymer in the polymer layer (B) is roughly divided into two kinds: (B-1) and (B-2). They will be sequentially described hereinafter.

In the polymer in the polymer layer (B), (B-1) is a non-aromatic saturated hydrocarbon group-containing organopolysiloxane containing units represented as (I) to (III):
(I) a siloxane unit represented by $R^9SiO_{3/2}$ (T unit): 50 to 99 mol %;
(II) a siloxane unit represented by $R^{10}R^{11}SiO_{2/2}$ (D unit) 0 to 49 mol %; and
(III) a siloxane unit represented by $R^{12}{}_3SiO_{1/2}$ (M unit): 1 to 15 mol %,
wherein, $R^9$ to $R^{12}$ represent a monovalent organic group, 50 to 80 mol % of all the organic groups represented by $R^9$ to $R^{11}$ represent the same or different non-aromatic saturated hydrocarbon groups having the following cyclic structures having 5 to 7 carbon atoms:

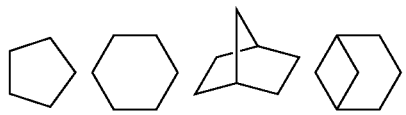

10 to 40 mol % of the organic groups represent the same or different substituted or unsubstituted monovalent acyclic saturated hydrocarbon groups having 6 to 15 carbon atoms, and groups other than the cyclic and acyclic saturated hydrocarbon groups in all the organic groups represented by $R^9$ to $R^{12}$ represent the same or different substituted or unsubstituted monovalent hydrocarbon groups having 1 to 5 carbon atoms.

50 to 80 mol % of all the organic groups represented by $R^9$ to $R^{11}$ represent the same or different non-aromatic saturated hydrocarbon groups having the above-described cyclic structures having 5 to 7 carbon atoms, and 10 to 40 mol % of the organic groups represent the same or different substituted or unsubstituted monovalent acyclic saturated hydrocarbon groups having 6 to 15 carbon atoms, and groups other than the non-aromatic saturated hydrocarbon groups having the above-described cyclic structures having 5 to 7 carbon atoms and substituted or unsubstituted monovalent acyclic saturated hydrocarbon groups having 6 to 15 carbon atoms in all the organic groups represented by $R^9$ to $R^{11}$ represent the same or different substituted or unsubstituted monovalent hydrocarbon groups having 1 to 5 carbon atoms.

In the general formula, $R^{12}$ may be the same or different, and represent a non-aromatic saturated hydrocarbon group having 1 to 5 carbon atoms. Specific examples thereof include a n-propyl group, an isopropyl group, a n-butyl group, an isobutyl group, a tert-butyl group, and a n-pentyl group.

In particular, in order to develop a difference in solubility, the content of the non-aromatic saturated hydrocarbon group having a cyclic structure is important, and the content of the non-aromatic cyclic saturated hydrocarbon group in $R^9$ to $R^{11}$ is preferably 50 to 80 mol %. When the content is 50 mol % or more, it is not difficult that the polymer becomes poorly soluble in a polar organic solvent used during applying or removing a photoresist to or from a semiconductor side of a bonded substrate. Therefore, this is preferable. In contrast, when the amount is 80 mol % or less, there is no risk of causing a crack after coating a silicon substrate. Therefore, this is preferable. When the content falls within a range of 50 to 80 mol %, the polymer cannot dissolved in a polar solvent having an SP value [solubility parameter (cal/cm$^3$)$^{1/2}$] higher than 9, such as acetone (SP: 10.0) and N-methylpyrolidone (SP: 11.2), but can be dissolved in a hydrocarbon-based non-polar solvent, such as n-hexane (SP: 7.3) and isododecane (SP: 7.7).

Further, in order to improve a difference in solubility and the bondability of polysiloxane, the content of the acyclic saturated hydrocarbon group is also important. The content of the substituted or unsubstituted monovalent acyclic saturated hydrocarbon group having a 6 to 15 carbon atoms in $R^9$ to $R^{11}$ is preferably 10 to 40 mol %. When the content is 10 mol % or more, it is expected to improve the bondability. Therefore, this is preferable. When the content is 40 mol % or less, the viscosity extremely does not decrease at high temperature, and there is no risk of not achieving sufficient heat resistance. Therefore, this is preferable.

The non-aromatic saturated hydrocarbon group-containing organopolysiloxane contains (I) 50 to 99 mol % of the siloxane unit (T unit) represented by $R^9SiO_{3/2}$, (II) 0 to 49 mol % of the siloxane unit (D unit) represented by $R^{10}R^{11}SiO_{2/2}$, and (III) 1 to 15 mol % of the siloxane unit (M unit) represented by $R^{12}{}_3SiO_{1/2}$. The organopolysiloxane of the above-described structure can be produced by controlling hydrolysis and condensation reaction of a hydrolyzable silane as a starting material. Further, in terms of handling, it is preferable that the non-aromatic saturated hydrocarbon group-containing organopolysiloxane of the present invention be one in a solid form at a temperature not exceeding 40° C.

Examples of the hydrolysable silane usable as the starting material include methyltrichlorosilane, phenyltrichlorosilane, n-propyltrichlorosilane, isopropyltrichlorosilane, n-butyltrichlorosilane, isobutyltrichlorosilane, n-pentyltrichlorosilane, isopentyltrichlorosilane, n-hexyltrichlorosilane, cyclohexyltrichlorosilane, n-octyltrichlorosilane, n-decyltrichlorosilane, n-dodecyltrichlorosilane, bicyclo[2.2.1]heptyltrichlorosilane (C1), bicyclo[2.2.1]nonyltrichlorosilane (C2), dimethyldichlorosilane, n-propylmethyldichlorosilane, isopropylmethyldichlorosilane, n-butylmethyldichlorosilane, isobutylmethyldichlorosilane, n-hexylmethyldichlorosilane, n-octylmethyldichlorosilane, n-decylmethyldichlorosilane, n-dodecylmethyldichlorosilane, cyclohexylmethyldichlorosilane, diphenyldichlorosilane, bicyclo[2.2.1]heptylmethyldichlorosilane (C3), bicyclo[2.2.1]nonylmethyldichlorosilane (C4), and these of which a hydrolysable group is a methoxy group or an ethoxy group.

In particular, (C1) to (C4) having a plurality of cyclic structures as described below are present in stereoisomeric forms such as an endo form and an exo form, and they can be all used.

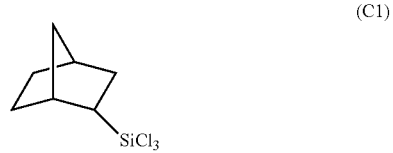

(C1)

-continued

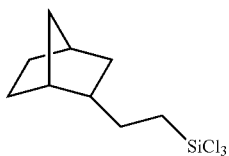
(C2)

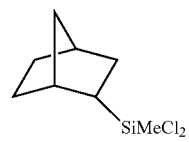
(C3)

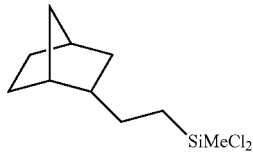
(C4)

When 50 to 99 mol % of the T unit is contained, the non-aromatic saturated hydrocarbon group-containing organopolysiloxane is readily solidified at a temperature of 40° C. or lower. When 50 mol % or more of the T unit is contained, the non-aromatic saturated hydrocarbon group-containing organopolysiloxane is readily solidified at a temperature of 40° C. or lower, and suitable for bonding substrates. Further, from the viewpoint of thermal stability, it is preferable that a reactive terminal group, that is, silanol and a hydrolyzable residue be not left in the non-aromatic saturated hydrocarbon group-containing organopolysiloxane. Therefore, a structure in which the M unit is introduced to the terminal is preferable, and it is preferable that the content of the M unit be 1 mol % or more.

When 49 mol % or less of the D unit is contained, the non-aromatic saturated hydrocarbon group-containing organopolysiloxane of the present invention is readily solidified at a temperature of 40° C. or lower. In the case of using the organopolysiloxane for a temporary adhesive composition, a wafer and a supporting substrate can be sufficiently bonded.

When 1 to 15 mol % of the M unit is contained, the non-aromatic saturated hydrocarbon group-containing organopolysiloxane has a structure in which a reactive terminal group is sufficiently decreased. When the content of the M unit is 1 mol % or more, it is possible to form a structure in which a reactive terminal group such as a silanol and a hydrolyzable residue is sufficiently decreased. Further, when the content is 15 mol % or less, the molecular weight does not relatively decrease because of an increase in the amount of the terminal group.

When a molecular-terminal group not sealed by the M unit, that is, a silanol group, or a hydrolyzable residue such as an alkoxysilyl group is present, it is preferable that the content of these reactive terminal groups be small as much as possible. When the amount of the terminal group such as a silanol group and an alkoxysilyl group in a molecule is small, it is possible to suppress the generation of crosslinkage due to a condensation reaction and large change in the delaminatability of a substrate during application of heat. Therefore, this is preferable. Further, it is preferable that the total amount of an OH group of a silanol group and an OR group of an alkoxysilyl group (Si—OR: R represents an alkoxy group residue of alkoxysilane used as the starting material, such as a methoxy group, an ethoxy group, an n-propyl group, and an isopropyl group) be 5% by mass or less, and preferably 3% by mass or less, relative to the total solid content of the resin. When the M unit is introduced, the amount of such a reactive terminal group can be decreased to a desired amount.

The molecular weight distribution of the non-aromatic saturated hydrocarbon group-containing organopolysiloxane in the present invention is very important. Namely, it is preferable that a value of a weight average molecular weight determined by gel permeation chromatography (GPC) using a calibration curve prepared using a polystyrene standard sample be 2,000 or more. When the weight average molecular weight of the non-aromatic saturated hydrocarbon group-containing organopolysiloxane is 2,000 or more, a difference in solubility in polar and non-polar solvents appears. When it is 60,000 or less, the non-aromatic saturated hydrocarbon group-containing organopolysiloxane can be synthesized with stability and good reproducibly of the molecular weight thereof. The preferable range of the weight average molecular weight of non-aromatic saturated hydrocarbon group-containing organopolysiloxane is preferably about 3,000 to about 50,000, and more preferably about 5,000 to about 30,000.

As a GPC apparatus that can be used for such analysis, HLC-8120GPC, HLC-8220GPC, or HLC-8230GPC manufactured by Tosoh Corporation can be used.

In the polymer in the polymer layer (B), (B-2) is organopolysiloxane which is obtained by a hydrosilylation reaction between an alkenyl group-containing organopolysiloxane (B') which is a non-aromatic saturated hydrocarbon group-containing organopolysiloxane containing the following units (I) to (III):

(I) a siloxane unit represented by $R^9SiO_{3/2}$ (T unit): 50 to 99 mol %;
(II) a siloxane unit represented by $R^{10}R^{11}SiO_{2/2}$ (D unit): 0 to 49 mol %; and
(III) a siloxane unit represented by $R^{12}_3SiO_{1/2}$ (M unit): 1 to 15 mol %, wherein, $R^9$ to $R^{12}$ represent a monovalent organic group, 50 to 80 mol % of all the organic groups represented by $R^9$ to $R^{11}$ represent the same or different non-aromatic saturated hydrocarbon groups having the following cyclic structures having 5 to 7 carbon atoms,

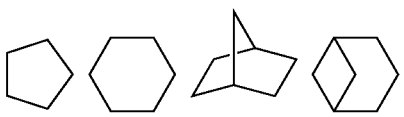

10 to 40 mol % of the organic groups represent the same or different substituted or unsubstituted monovalent acyclic saturated hydrocarbon groups having 6 to 15 carbon atoms, and groups other than the cyclic and acyclic saturated hydrocarbon groups in all the organic groups represented by $R^9$ to $R^{12}$ represent the same or different substituted or unsubstituted monovalent hydrocarbon groups having 1 to 5 carbon atoms, the alkenyl group-containing organopolysiloxane (B') in which 2 to 10 mol % of all the organic groups represented by $R^9$ to $R^{12}$ are alkenyl groups having 2 to 7 carbon atoms, and an organohydrogenpolysiloxane in such an amount that the total amount of SiH groups is 0.4 to 1.0 times larger than the total amount of alkenyl groups in the alkenyl group-containing organopolysiloxane (B'), wherein the organohydrogenopolysiloxane is represented by the following general formula (5),

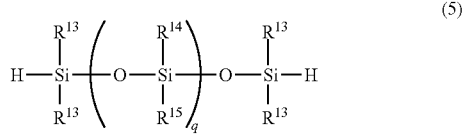

wherein, $R^{13}$ to $R^{15}$ may be the same or different, and represent a monovalent hydrocarbon group having 1 to 12 carbon atoms other than an alkenyl group; and "q" represents an integer of 0 to 100; provided that two or more kinds of different organohydrogenpolysiloxanes may be used, in the presence of a platinum group metal-based catalyst.

At this time, the content of the alkenyl group is at least 2 mol % to 10 mol % of all the organic groups represented by $R^9$ to $R^{12}$. When the content of the alkenyl group is 2 mol % or more, the molecular weight greatly increases due to the hydrosilylation reaction, and organopolysiloxane that is superior in physical properties such as heat resistance can be obtained. Therefore, this is preferable. In contrast, when the content is 10 mol % or less, the solubility in a polar organic solvent used during applying or removing a photoresist to or from a semiconductor side of a bonded substrate further decreases. Therefore, this is preferable.

Examples of such an alkenyl group include a vinyl group, an allyl group, a butenyl group, a hexenyl group, a cyclohexenyl group, and a norbornenyl group. From the viewpoint of reactivity, a vinyl group is preferable.

The total amount of SiH groups of the component (5) is preferably 0.4 to 1.0 times larger than the total amount of alkenyl group in the component (B'). When the ratio is 0.4 or more, an increase in the molecular weight is sufficient, and desired heat resistance and bondability can be achieved. Further, when the ratio is 1.0 or less, crosslinkage of the resin becomes appropriate, and gelation hardly occurs. Further, SiH groups remaining in the resin can be reduced, and foaming due to the remaining SiH can be suppressed during a heat test after bonding. Therefore, this is preferable.

Further, $R^{13}$ to $R^{15}$ may be the same or different, and represent a monovalent hydrocarbon group having 1 to 12 carbon atoms other than an alkenyl group. Specific examples thereof include a methyl group, a propyl group, a hexyl group, a cyclohexyl group, a phenyl group, a decyl group, and a dodecyl group. A methyl group, a cyclohexyl group, and a phenyl group are particularly preferable.

The polymerization degree "q" of the organohydrogenpolysiloxane represented by the structural formula (5) is preferably an integer of 0 to 100, and particularly preferably 0 to 60. When "q" is 100 or less, a hydrosilylation reaction with the alkenyl group in the alkenyl group-containing organopolysiloxane (B') during synthesis readily proceeds, and there is no risk of not sufficiently promoting the reaction. Therefore, this is preferable. In addition, there is no risk of significantly decreasing the adhesion between organopolysiloxane subjected to the hydrosilylation reaction and a wafer, and therefore, this is preferable.

When "q" falls within the above-described range, an addition reaction may be carried out using a different type of organohydrogenpolysiloxane.

Such organohydrogenpolysiloxane subjected to the hydrosilylation reaction is soluble in a non-polar organic solvent, but poorly soluble in a polar organic solvent used during applying or removing a photoresist to or from a semiconductor side of a bonded substrate. In addition, the organopolysiloxane is further excellent in bondability and heat resistance.

In a reaction of the alkenyl group-containing organopolysiloxane (B') with the organohydrogenpolysiloxane (5), the alkenyl group-containing organopolysiloxane (B') is dissolved in an organic solvent, a platinum group metal-based catalyst as a hydrosilylation catalyst is added, and the organohydrogenpolysiloxane (5) is added dropwise under heating at 50 to 150° C., to obtain organopolysiloxane subjected to the hydrosilylation reaction.

The platinum group metal-based catalyst is a catalyst to promote a hydrosilylation reaction with an SiH group, and examples of this addition reaction catalyst include a platinum-based catalyst such as platinum black, platinic chloride, chloroplatinic acid, a reaction product of chloroplatinic acid with monohydric alcohol, a complex of chloroplatinic acid with olefins, and platinum bisacetoacetate, and a platinum group metal catalyst such as a palladium-based catalyst and a rhodium-based catalyst. The amount of the addition reaction catalyst to be added can be a catalytic amount, but in general, it is preferable that the platinum group metal be added in a ratio of 1 to 800 ppm, especially about 2 to 300 ppm, relative to the weight of the component (B').

The molecular weight of such organopolysiloxane subjected to the hydrosilylation reaction affects characteristics of the temporary adhesive, especially thermal deformation during heating, generation of a void on an adhesive interface, and the like.

The weight average molecular weight Mw of such organopolysiloxane subjected to the hydrosilylation reaction is a value of a weight average molecular weight determined by gel permeation chromatography (GPC) using a calibration curve prepared using a polystyrene standard sample, and the value is preferably 30,000 to 200,000. When organopolysiloxane has the above-described weight average molecular weight, heat resistance is excellent and a void is not generated. A preferable weight average molecular weight is within a range of about 35,000 to about 170,000, and more preferably about 40,000 to about 150,000.

In order to further enhance the heat resistance of the second temporary adhesive layer, a known antioxidant or the like may be added in an amount of 50 μparts by mass or less, relative to 100 μparts by mass of the silicone-containing polymer (B).

The film for temporary adhesion of the present invention may have a temporary adhesive layer made of the temporary adhesive material for a wafer.

It is preferable that the first and second temporary adhesive layers be film state respectively. The first and second temporary adhesive layers may be formed in this order on a support, the second and first temporary adhesive layers may be formed in this order on a wafer, or the first and second temporary adhesive layers may be formed on a wafer or a support after the layers are laminated.

Alternatively, the first and second temporary adhesive layers may be formed by a method of applying a solution in which compositions of the first and second temporary adhesive layers are dissolved, specifically, a spin coating method, a roll coater method, and a die coater method.

In this case, examples of a solvent capable of dissolving the composition of the first temporary adhesive layer include ketones such as cyclohexanone, cyclopentanone, and methyl 2-n-amyl ketone; alcohols such as 3-methoxy buthanol, 3-methyl-3-methoxy buthanol, 1-methoxy-2-propanol, and 1-ethoxy-2-propanol; ethers such as propyleneglycol monomethyl ether, ethyleneglycol monomethyl ether, propyleneglycol monoethyl ether, ethyleneglycol monoethyl ether, propyleneglycol dimethyl ether, and diethyleneglycol dimethyl ether; esters such as propyleneglycol monomethyl ether acetate, propyleneglycol monoethyl ether acetate, ethyl lactate, ethyl pilvate, butyl acetate, methyl 3-methoxypropionate, ethyl 3-ethoxypropionate, tert-butyl acetate, tert-butyl propionate, and propyleneglycol mono-tert-butyl ether acetate; and γ-butyrolactone. These solvents may be used singly, or in a combination of two or more kinds.

The amount of the solvent to be used is preferably 20 to 200 µarts by mass, and more preferably 40 to 150 parts by mass, relative to 100 µarts by mass of the weight of the composition of the first temporary adhesive layer.

Examples of a method for forming a film of the first temporary adhesive layer include a method in which a composition of the above first temporary adhesive layer is made into film on a releasable support. At this time, a range of a temperature at forming film is preferably 60 to 160° C., particularly preferably 80 to 150° C. At such a range of temperature, a thermal acid generator is not decomposed, and a solvent can be sufficiently removed.

Examples of a solvent capable of dissolving the composition of the second temporary adhesive layer include pentane, hexane, cyclopentane, cyclohexane, methylcyclohexane, octane, isooctane, decane, undecane, isododecane, limonene, and pinene. These solvents may be used singly, or in a combination of two or more kinds.

The amount of the solvent to be used is preferably 20 to 200 µarts by mass, and more preferably 40 to 150 parts by mass, relative to 100 µarts by mass of the weight of the composition of the second temporary adhesive layer.

Examples of a method for forming a film of the second temporary adhesive layer include a method in which a composition of the above second temporary adhesive layer is made into film on a releasable support. At this time, a range of a temperature at forming is preferably 80 to 220° C., particularly preferably 100 to 200° C. At such a range of temperature, a resin is not decomposed, and a solvent can be sufficiently removed.

The first and second temporary adhesive layer films can be used by bonding both of them.

<Method for Producing Thin Wafer>

In the method for producing a thin wafer of the present invention, a temporary adhesive material consisting of two layers, the first and second temporary adhesive layers, is used for a temporary adhesive layer between a support and a wafer having a semiconductor circuit or the like. A thin wafer produced by the method of the present invention typically has a thickness of 5 to 300 µm, and more typically 10 to 100 µm.

As shown in FIG. 1, in a wafer processing laminate using the temporary adhesive material of the present invention for bonding, a temporary adhesive material 3 of two layers is between a support 1 and a wafer 2, and a first temporary adhesive layer of a silicone-containing polymer layer (A) containing a photo base generator and a second temporary adhesive layer of a silicone-containing polymer layer (B) which does not contain the photo base generator and is different from the polymer layer (A) are provided. The second temporary adhesive layer releasably adheres to the front surface of the wafer of which the front surface has a circuit side and the back surface is to be processed. The first temporary adhesive layer releasably adheres to the support.

The method for producing a thin wafer of the present invention includes steps (a) to (e):
(a) a step of bonding a surface with a circuit of a wafer which has the surface with a circuit as the front surface and a surface without a circuit as the back surface to a support via the temporary adhesive material for a wafer or the temporary adhesive layer included in the film for temporary adhesion;
(b) a step of grinding or polishing the surface without a circuit of the wafer bonded to the support;
(c) a step of processing the surface without a circuit of the wafer;
(d) a step of delaminating the processed wafer from the support by light irradiation; and
(e) a step of removing a temporary adhesive material remaining on the surface with a circuit of the delaminated wafer.

Step (a)

The step (a) is a step of bonding a surface with a circuit of a wafer which has the surface with a circuit as the front surface and a surface without a circuit as the back surface to a support via a temporary adhesive material consisting of two layers, the first and second temporary adhesive layers. A wafer which has a surface with a circuit and a surface without a circuit is a wafer of which the surface is a surface with a circuit and the other surface is a surface without a circuit. A wafer to which the present invention is applied is generally a semiconductor wafer. Examples of the semiconductor wafer include, in addition of a silicon wafer, a germanium wafer, a gallium-arsenic wafer, a gallium-phosphorus wafer, and a gallium-arsenic-aluminum wafer. The thickness of the wafer is not particularly limited, and is typically 600 to 800 µm, and more typically 625 to 775 µm.

As the support, a substrate capable of transmitting light, which is made of glass, quartz, or the like can be used.

The support and wafer in which the first and second temporary adhesive layers are formed are formed as a substrate bonded via the first and second temporary adhesive layers. In this case, the substrate is pressure-bonded uniformly at a temperature in a temperature region of preferably 40 to 170° C., and more preferably 50 to 160° C., under reduced pressure to form a wafer processing laminate (laminate substrate) in which the wafer is bonded to the support.

Examples of a wafer bonding apparatus include a commercially available wafer bonding apparatus, for example, EVG520IS and 850 TB manufactured by EV Group and XBC300 manufactured by SUSS MicroTec AG.

Step (b)

The step (b) is a step of grinding or polishing the surface without a circuit of the wafer, that is, grinding or polishing the wafer back surface side of the wafer processing laminate obtained by bonding in the step (a), to decrease the thickness of the wafer. A procedure of grinding the wafer back surface is not particularly limited, and a known grinding procedure may be used. It is preferable that the grinding be carried out while water is poured on the wafer and a grindstone (diamond, etc.) for cooling. Examples of an apparatus for grinding the back surface of the wafer include DAG-810 (trade name) manufactured by DISCO Corporation.

Step (c)

The step (c) is a step of processing the surface without a circuit of the wafer processing laminate obtained by grinding the surface without a circuit, i.e., the surface without a circuit of the wafer processing laminate which has been thinned by grinding the back surface. This step includes various processes which can be applied at a wafer level. Examples thereof include electrode formation, metal wiring formation, and protective film formation. Specific examples thereof include a conventionally known process such as metal sputtering for formation of an electrode, or the like, wet etching for etching of a sputtered metal layer, formation of a pattern by applying a resist as a mask for formation of a metal wiring, followed by exposure and development, delaminating of a resist, dry etching, formation of a metal plating, silicon etching for formation of a TSV, and formation of an oxide film on a silicon surface.

Step (d)

The step (d) is a step of delaminating the wafer which has been processed in the step (c) from the support, that is, delaminating the wafer which has been thinned and subjected to various processes from the support before dicing. Examples of a delaminating method include a method in which a thinned wafer is fixed, irradiated with a light with a wavelength of 190 to 500 nm from a support side, and the support is lifted at a constant angle in a horizontal direction, and a method for delaminating a wafer and a protective film from a wafer processing laminate by a delaminating procedure.

Step (e)

The step (e) is a step of removing the second temporary adhesive layer remaining on the surface with a circuit of the delaminated wafer. The second temporary adhesive layer remains on the surface with a circuit of the wafer delaminated from the support in the step (d). The second temporary adhesive layer can be removed, for example, by a method in which a protective film is attached to the surface with a circuit of the wafer, that is, a surface remaining the second temporary adhesive layer and the second temporary adhesive layer is delaminated by the delaminating procedure, or by cleaning the wafer.

In the step (e), any cleaning liquid may be used as long as it is capable of dissolving a thermoplastic organopolysiloxane which is the polymer in the polymer layer (B) of the second temporary adhesive layer. Specific examples thereof include pentane, hexane, cyclohexane, decane, isododecane, and limonene. These solvents may be used singly or in combination of two or more kinds. Further, when removal is difficult, a base or an acid may be added to the solvent. Examples of the base include an amine such as ethanolamine, diethanolamine, triethanolamine, triethylamine, and ammonia, and an ammonium salt such as tetramethylammonium hydroxide. As the acid, an organic acid such as acetic acid, oxalic acid, benzenesulfonic acid, and dodecylbenzenesulfonic acid can be used. The amount of the acid or base to be added is 0.01 to 10% by mass, and preferably 0.1 to 5% by mass, as a concentration in the cleaning liquid. In order to improve the removability of the residue, an already known surfactant may be also added. Examples of a cleaning method include a cleaning method using a paddle and the liquid described above, a cleaning method by spray atomization, and a method of immersion in a tank containing the cleaning liquid. The temperature is preferably 10 to 80° C., and more preferably 15 to 65° C. Finally, water or alcohol cleaning is carried out, drying may be done to obtain a thin wafer.

EXAMPLES

Hereinafter, the present invention will be more specifically described with reference to Examples and Comparative Examples, but the present invention is not limited to these Examples.

Synthesis Example 1

In a flask equipped with a stirrer, a thermometer, a nitrogen purge system, and a reflux condenser, 43.1 g of 9,9'-bis(3-allyl-4-hydroxyphenyl)fluorene (M-1), 29.5 g of organohydrogenpolysiloxane having an average structural formula (M-3), 135 g of toluene, and 0.04 g of chloroplatinic acid were placed, and heated at 80° C. 17.5 g of 1,4-bis(dimethylsilyl)benzene (M-5) was then added dropwise to the flask over 1 hour. At this time, the temperature in the flask was increased to 85° C. After the completion of dropwise addition, the mixture was aged at 80° C. for 2 hours, toluene was distilled off, and 80 g of cyclohexanone was added, to obtain a resin solution (A-1) containing cyclohexanone as a solvent, and having a resin solid concentration of 50% by mass. The molecular weight of the resin in the solution was determined by GPC, and the weight average molecular weight was 45,000 in terms of polystyrene.

Synthesis Example 2

In a 5-L flask equipped with a stirrer, a thermometer, a nitrogen purge system, and a reflux condenser, 396.9 g of compound (M-1) and 45.0 g of compound (M-2) were dissolved in 1,875 g of toluene. 949.6 g of compound (M-3) and 6.1 g of compound (M-4) were then added to the flask, and heated at 60° C. After then, 2.2 g of carbon-supported platinum catalyst (5% by mass) was added. It was confirmed that the internal reaction temperature was increased to 65 to 67° C. The temperature was then increased to 90° C. for 3 hours, and decreased to 60° C. 2.2 g of carbon-supported platinum catalyst (5% by mass) was added, and 107.3 g of compound (M-5) was added dropwise to the flask over 1 hour. The temperature in the flask was increased to 78° C. After the completion of dropwise addition, the mixture was aged at 90° C. for 3 hours, and cooled to room temperature. 1,700 g of methyl isobutyl ketone (MIBK) was added. The reaction solution was filtered under pressure through a filter to remove the platinum catalyst. 760 g of pure water was then added to the resulting polymer solution, and the mixture was stirred, allowed to stand, and separated. An aqueous layer of a lower layer was removed. The separation and water-washing operation was repeated six times to remove a slight amount of acid component in the polymer solution. The solvent in the resin solution was distilled under reduced pressure and 950 g of cyclopentanone was added to obtain a resin solution (A-2) containing cyclopentanone as a solvent, and having a solid content concentration of 60% by mass. The molecular weight of the resin in the resin solution was determined by GPC, and the weight average molecular weight was 62,000 in terms of polystyrene. In the formula (2), the value of (c+d)/(a+b+c+d) was 0.10.

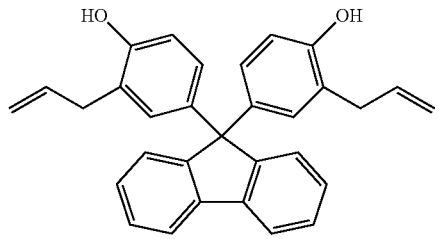

(M-1)

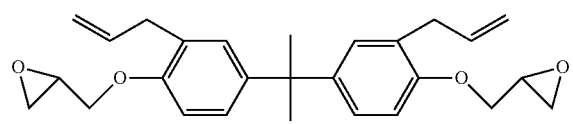

(M-2)

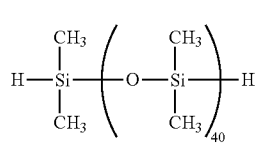

(M-3)

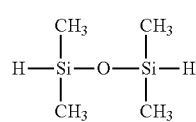

(M-4)

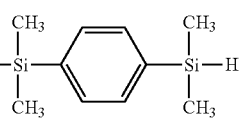

(M-5)

Synthesis Example 3

In a 5-L flask equipped with a stirrer, a thermometer, a nitrogen purge system, and a reflux condenser, 84.1 g of epoxy compound (M-2) was dissolved in 600 g of toluene. 294.6 g of compound (M-3) and 25.5 g of compound (M-4) were then added to the flask, and heated at 60° C. After then, 1 g of carbon-supported platinum catalyst (5% by mass) was added. It was confirmed that the internal reaction temperature was increased to 65 to 67° C. The temperature was then increased to 90° C., and the mixture was aged for 3 hours and cooled to room temperature. 600 g of methyl isobutyl ketone (MIBK) was added. The reaction solution was filtered under pressure through a filter to remove the platinum catalyst. The solvent in the resin solution was distilled under reduced pressure and 270 g of cyclopentanone was added to obtain a resin solution (A-3) containing cyclopentanone as a solvent, and having a solid content concentration of 60% by mass. The molecular weight of the resin in the resin solution was determined by GPC, and the weight average molecular weight was 28,000 in terms of polystyrene. In the formula (2), the value of (c+d)/(a+b+c+d) was 1.

Synthesis Example 4

In a 1-L flask equipped with a stirrer, a cooling apparatus, and a thermometer, 234 g (13 mol) of water and 35 g of toluene were placed, and heated to 80° C. in an oil bath. 108.8 g (0.5 mol) of cyclohexyltrichlorosilane, 65.9 g (0.3 mol) of n-hexyltrichlorosilane, 12.9 g (0.1 mol) of dimethyldichlorosilane, and 10.9 g (0.1 mol) of trimethylchlorosilane were placed in a dropping funnel, and the mixture was added dropwise to the flask with stirring over 1 hour. After completion of the dropwise addition, the resultant mixture was further stirred and aged at 80° C. for 1 hour. The mixture was allowed to stand while cooled to room temperature, and a separated aqueous phase was removed. A 1% sodium sulfate aqueous solution was continuously added, the mixture was stirred for 10 minutes, and allowed to stand for 30 minutes, and a separated aqueous phase was removed. This water-washing operation was repeated until a toluene phase was neutral, and a reaction was stopped. An ester adapter was disposed, the toluene phase containing organopolysiloxane was heated to reflux, and water was removed from the toluene phase. This operation was continued for 1 hour after an inner temperature reached 110° C., and the temperature was decreased to room temperature. The obtained organopolysiloxane solution was filtered to remove an insoluble matter, and toluene was continuously removed by distillation under reduced pressure, to obtain 119.1 g of solid organopolysiloxane.

The obtained organopolysiloxane contained 80 mol % of the T unit, 10 mol % of the D unit, and 10 mol % of the M unit, a terminal thereof contained 0.06 mol of a silanol group per 100 g of organopolysiloxane, an appearance thereof was a clear and colorless solid, and the weight average molecular weight thereof was 44,000 in terms of polystyrene. The content of a cyclohexyl group in all organic groups was 38 mol %, and the content of a n-hexyl group was 23 mol %. Further, 50 mol % of organic groups represented by $R^9$ to $R^{11}$ corresponds to the cyclohexyl group, 30 mol % corresponds to the n-hexyl group, and 20 mol % corresponds to the methyl group.

The organopolysiloxane was dissolved in isononane. A second temporary adhesive composition B-I was obtained by microfiltration using a 0.2 μm Teflon (registered trademark) filter.

Synthesis Example 5

In a 2-L flask, 468 g (26 mol) of water and 70 g of toluene were placed, and heated to 80° C. in an oil bath by the same procedure as in Synthesis Example 4. 228.8 g of solid organopolysiloxane was prepared in the same manner as in Synthesis Example 4 except that 275.6 g (1.2 mol) of norbornyltrichlorosilane, 65.8 g (0.3 mol) of n-hexyltrichlorosilane, 25.8 g (0.2 mol) of dimethyldichlorosilane, 14.2 g (0.1 mol) of methylvinyldichlorosilane, and 21.8 g (0.2 mol) of trimethylchlorosilane were placed in a dropping funnel.

The obtained organopolysiloxane contained 75 mol % of the T unit, 15 mol % of the D unit, and 10 mol % of the M unit, and contained 0.07 mol of a silanol group and 0.039 mol of a vinyl group per 100 g of organopolysiloxane. An appearance thereof was a clear and colorless solid, and the weight average molecular weight thereof was 9,300. The content of a norbornyl group in all organic groups was 44 mol %, the content of a n-hexyl group was 11 mol %, and the content of the vinyl group was 3.7 mol %. Further, 57% in all organic groups represented by $R^9$ to $R^{11}$ corresponds to the norbornyl group, 14% corresponds to the n-hexyl group, 24 mol % corresponds to the methyl group, and 4.8 mol % corresponds to the vinyl group.

Synthesis Example 6

As alkenyl group-containing organopolysiloxane, 100 g of solid organopolysiloxane obtained in Synthesis Example 5 was dissolved in 100 g of toluene, and a solution having a solid content concentration of 50% was prepared. To this solution, a platinum catalyst was added in a ratio of platinum atom to the resin of 20 ppm, and heated to 60° C. 44.6 g of compound (SiH equivalent: 2,287 g/mol) represented by the following formula (7) as organohydrogenpolysiloxane was added dropwise. At this time, heat generation by a reaction was confirmed. This amount corresponds to 0.5 of H/Vi ratio (ratio of the amount of SiH groups to the total amount of alkenyl groups). A reaction was carried out at 100° C. for 2 hours, and then completed. After then, condensation was carried out by distillation under reduced pressure, toluene was removed, and a reaction product was solidified, to obtain organopolysiloxane subjected to a hydrosilylation reaction. Moreover, the weight average molecular weight Mw of this resin was measured by GPC, to be 41,000. The organopolysiloxane subjected to the hydrosilylation reaction was dissolved in isononane. A second temporary adhesive composition B-II was obtained by microfiltration using a 0.2 µm Teflon (registered trademark) filter.

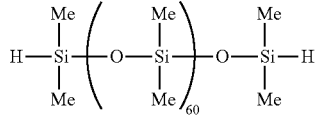

(7)

Wherein, Me represents a methyl group.

Hereinafter, Examples and Comparative Examples will be described. Photo base generators which are used in Examples and Comparative Examples of the present invention and described in Table 1 shown below are as follows.

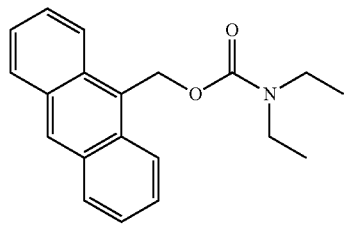

(PBG-1)

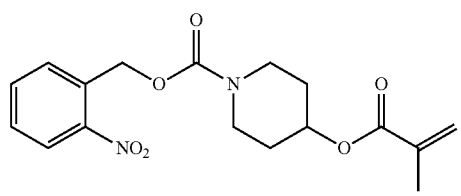

(PBG-2)

A thermal acid generator which is used in Examples and Comparative Examples of the present invention and described in Table 1 shown below is as follows.

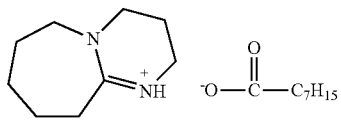

(TAG-1)

Further, cross-linking agents which are used in Examples and Comparative Examples of the present invention and described in Table 1 shown below are as follows.

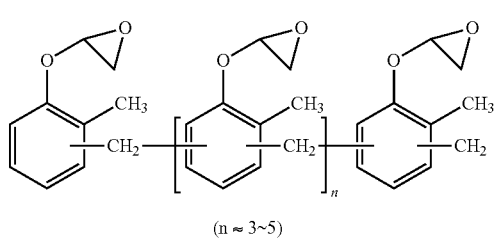

(EP-1)

(n ≈ 3~5)

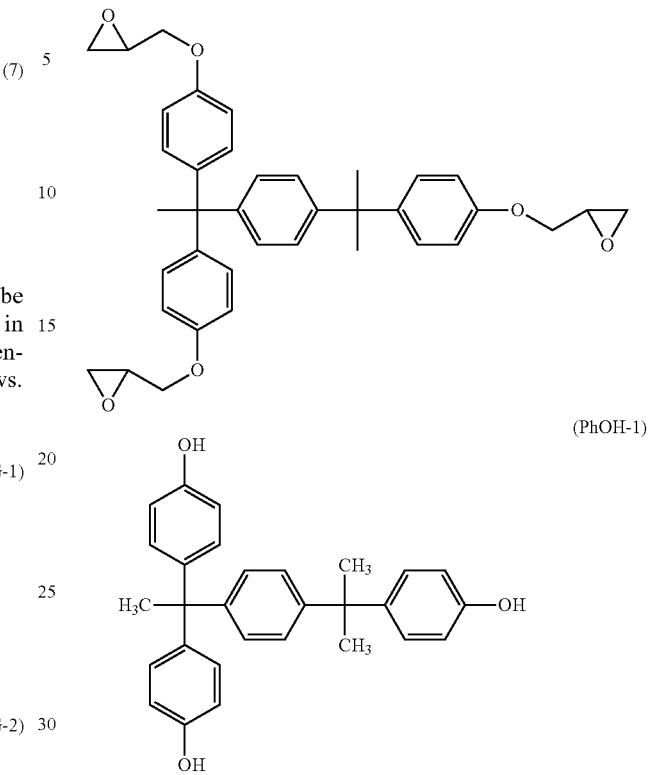

The thermosetting modified siloxane polymer A-1, A-2, or A-3 synthesized as the polymer in the polymer layer (A) in Synthesis Example 1, 2, or 3, respectively, in an addition amount shown in Table 1, a silicone-containing polymer, a photo base generator, a thermal acid generator, and a cross-linking agent were added to a solvent, the mixture was stirred, mixed, and dissolved at normal temperature. By microfiltration through a 0.2 µm Teflon (registered trademark) filter, thermosetting resin compositions in Examples 1 to 8 and Comparative Example 1 were obtained.

Preparation Example of Resin Film

A solution containing the resin (A-2) prepared in Synthesis Example 2, PBG-2, TAG-1, and EP-2 so that the contents of PBG-2, TAG-1, and EP-2 were 50, 1.0, and 10 parts by mass, respectively, relative to 100 parts by mass of the resin (A-2) was applied to a polyethylene terephthalate (PET) sheet with a thickness of 38 µm using a blade knife, and heated for 30 minutes in a drier at 90° C. to obtain a film (A-4) in which a resin layer with a thickness of 15 µm was formed on the PET sheet. A film (B-III) having a resin layer with a thickness of 40 µm was obtained by the same procedure as in the case of the resin solution (B-II) prepared in Synthesis Example 6.

Examples 1 to 5, 7 to 8 and Comparative Example 1

The thermosetting resin composition A-1, A-2, or A-3 was applied to a glass substrate with a diameter of 200 mm (thickness: 700 µm) as a support by spin coating to form a film. On the other hand, a film B-I or B-II with a thickness shown in Table 1 was formed on a surface with a bump of a silicon wafer with a diameter of 200 mm (thickness: 725 μm) in which copper posts with a height of 10 μm and a diameter of 40 μm were formed over the entire surface by spin coating. Thus, a resin layer was formed on a glass substrate and a silicon wafer.

Example 6

A-4 and B-III were laminated on the above-described glass substrate as a support and the above-described wafer, respectively, using a vacuum laminator (manufactured by Takatori Coporation, TEAM-100) at a wafer stage temperature of 100° C. under a vacuum of 100 Pa, allowed to stand for 10 seconds, and exposed to air to form a film with a thickness shown in Table 1. At this time, each resin is applied, formed, and heat-treated at 120° C. for 2 minutes by a hot plate to form a resin layers respectively.

The silicon wafer having the resin layer was bonded to the glass substrate having the resin layer in a vacuum bonding apparatus so that the resin sides were in contact, to produce a laminate (under a compression bonding condition).

After then, the following tests were carried out.
The results are shown in Table 1.

—Adhesion Test—

The wafers with a diameter of 200 mm was bonded by a wafer bonding apparatus EVG 520IS manufactured by EV Group. Each bonding was carried out at a bonding temperature listed in Table 1, a pressure in a chamber of $10^{-3}$ mbar or lower upon bonding, and a load of 15 kN. After bonding, the substrate was once heated in an oven at 160° C. for 3 hours for curing the polymer in the polymer layer (A). After cooling to room temperature, the interfacial bond state was visually observed. A case where no abnormalities like bubbles have occurred at the interface is evaluated as good and shown with "good", whereas a case where abnormalities have been detected is evaluated as poor and shown with "poor".

—Back Surface Grinding Durability Test—

The back surface of the silicon wafer was ground by a grinder (manufactured by DISCO Corporation, DAG810) using a diamond whetstone. The substrate was ground up to a final substrate thickness of 50 μm, and the presence or absence of abnormalities such as crack and delaminating was checked by an optical microscope (100 folds). A case where no abnormalities have occurred is evaluated as good and shown with "good", whereas a case where abnormalities have been detected is evaluated as poor and shown with "poor".

—Heat Resistance Test—

After the back surface of the silicon wafer had been ground, the laminate was placed in an oven at 150° C. under a nitrogen atmosphere for 30 minutes or 2 hours, The presence or absence of abnormalities in the appearance of the laminate was checked. A case where no abnormalities in the appearance have occurred is evaluated as good and shown with "good", whereas a case where abnormalities in the appearance have been detected is evaluated as poor and shown with "poor".

—Delaminatability Test—

In the delaminatability of the substrate, exposure was carried out at an exposure dose in Table 1 as a sensitivity from a side of the glass substrate support. The exposure was carried out using a contact aligner type exposure apparatus at 10,000 mJ/cm². A dicing tape was attached to the wafer side thinned to 50 μm, using a dicing frame. The dicing tape was sucked by vacuum sucking. One point of the glass substrate was lifted with forceps at room temperature, and the glass substrate support was delaminated. A case where the 50 μm wafer can be delaminated at the interface between first and second temporary adhesive layers without crack is evaluated as good and shown with "good", whereas a case where abnormalities such as crack have been detected is evaluated and shown with "poor".

—Cleaning Removability Test—

After the delaminatability test, the remained second temporary adhesive layer was delaminated using a tape for delaminating from a 200 mm wafer mounted on the dicing frame via the dicing tape (which had been exposed to the heat resistance test conditions) with the second temporary adhesive layer facing upward, and the wafer set on a spin coater. Isododecane as a cleaning solvent was sprayed for 3 minutes. Rinsing was carried out by spraying isopropyl alcohol (IPA) while the wafer was rotated. Subsequently, the appearance was observed and the presence or absence of residual adhesive resin was visually checked. A case where no resin residues have been detected is evaluated as good and shown with "good", whereas a case where resin residues have been detected is evaluated as poor and shown with "poor".

—Overall Evaluation—

Overall evaluation is performed based on the above-described evaluation test.

TABLE 1

|  | Example 1 | Example 2 | Example 3 | Example 4 | Example 5 | Example 6 | Comparative Example 1 | Example 7 | Example 8 |
|---|---|---|---|---|---|---|---|---|---|
| Resin layer (A) | A-1 | A-1 | A-2 | A-3 | A-3 | A-4 (film) | A-1 | A-1 | A-2 |
|  | 100 parts | 100 parts | 100 parts | 100 parts | 100 parts |  | 100 parts | 100 parts | 100 parts |
| Photo base generator | PBG-1 | PBG-2 | PBG-1 | PBG-2 | PBG-1 |  | PBG-1 | PBG-1 |  |
|  | 50 parts | 50 parts | 50 parts | 50 parts | 50 parts |  | None | 50 parts | 50 parts |
| Thermal acid generator | TAG-1 | TAG-1 | TAG-1 | TAG-1 | TAG-1 |  | TAG-1 | None | TAG-1 |
|  | 1 part | 1 part | 1 part | 1 part | 1 part |  | 1 part |  | 1 part |
| Cross-linking agent | EP-1 | EP-1 | EP-2 | EP-2 | PhOH-1 |  | EP-1 | EP-1 | None |
|  | 10 parts | 10 parts | 10 parts | 10 parts | 10 arts |  | 10 parts | 10 parts |  |
| Thickness of layer (A) | 15 μm | 15 μm | 12 μm | 12 μm | 12 μm | 15 μm | 13 μm | 12 μm | 9 μm |
| Resin layer (B) | B-I | B-II | B-I | B-II | B-I | B-III (film) | B-II | B-II | B-II |

TABLE 1-continued

| | Example 1 | Example 2 | Example 3 | Example 4 | Example 5 | Example 6 | Comparative Example 1 | Example 7 | Example 8 |
|---|---|---|---|---|---|---|---|---|---|
| Thickness of layer (B) | 30 μm | 50 μm | 30 μm | 50 μm | 30 μm | 40 μm | 50 μm | 50 μm | 50 μm |
| Adhesion temperature | 120° C. | 140° C. | 120° C. | 140° C. | 120° C. | 140 °C. | 140° C. | 140° C. | 140° C. |
| Adhesion | good | good | good | good | good | good | good | good | good |
| Back surface grinding durability | good | good | good | good | good | good | good | good | good |
| Heat resistance (30 minutes/ 2 hours) | good/good | good/good | good/good | good/good | good/good | good/good | good/good | good/poor | good/poor |
| Delaminatability after exposure | good | good | good | good | good | good | poor | good | good |
| Removability | good | good | good | good | good | good | — | good | good |
| Overall evaluation | very good | very good | very good | very good | very good | very good | poor | good | good |

As shown in Table 1, in Comparative Example 1 in which a photo base generator is not added, it is difficult to delaminate a glass supporting substrate. On the other hand, in Examples 1 to 8, the delaminatability due to decomposition of a photo base generator is excellent. Particularly, in Examples 1 to 6 in which a photo base generator, further a cross-linking agent and a thermal acid generator are added to the polymer layer (A), the heat resistance is more excellent. The temporary adhesive composition of the present invention can meet the above required characteristics.

Therefore, even on a wafer having a step, a temporary adhesive layer having high thickness uniformity can be formed. Because of the thickness uniformity, a thin wafer having a uniform thickness of 50 μm or less can be easily obtained. When a thin wafer is produced and then delaminated from a support, the wafer can be easily delaminated from the support by exposure at a low exposure dose. Therefore, a brittle thin wafer can be easily handled without causing damage. Accordingly, a thin wafer having high efficiency can be produced.

The present invention is not restricted to the above-described embodiments. The embodiments are merely examples, and any examples that have substantially the same configuration and demonstrate the same effects as the technical concept described in claims of the present invention are included in the technical scope of the present invention.

The invention claimed is:

1. A temporary adhesive material for a wafer comprising a first temporary adhesive layer of a silicone-containing polymer layer (A) containing a photo base generator and a second temporary adhesive layer of a silicone-containing polymer layer (B) which is laminated on the first temporary adhesive layer, does not contain the photo base generator, and is different from the polymer layer (A), wherein the polymer in the polymer layer (B) is a non-aromatic saturated hydrocarbon group-containing organopolysiloxane containing the following units (I) to (III):
   (I) a siloxane unit represented by $R^9SiO_{3/2}$ (T unit): 50 to 99 mol %;
   (II) a siloxane unit represented by $R^{10}R^{11}SiO_{2/2}$ (D unit): 0 to 49 mol %; and
   (III) a siloxane unit represented by $R^{12}{}_3SiO_{1/2}$ (M unit): 1 to 15 mol %, wherein, $R^9$ to $R^{12}$ represent a monovalent organic group, 50 to 80 mol % of all the organic groups represented by $R^9$ to $R^{11}$ represent the same or different non-aromatic saturated hydrocarbon groups having the following cyclic structures having 5 to 7 carbon atoms,

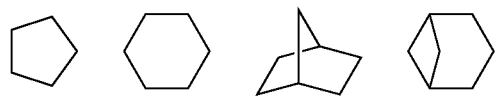

10 to 40 mol % of the organic groups represent the same or different substituted or unsubstituted monovalent acyclic saturated hydrocarbon groups having 6 to 15 carbon atoms, and groups other than the cyclic and acyclic saturated hydrocarbon groups in all the organic groups represented by $R^9$ to $R^{12}$ represent the same or different substituted or unsubstituted monovalent hydrocarbon groups having 1 to 5 carbon atoms.

2. The temporary adhesive material for a wafer according to claim 1, wherein the polymer layer (A) contains a thermosetting modified siloxane polymer including a silphenylene-containing polymer compound which has a weight average molecular weight of 3,000 to 500,000 and a repeating unit represented by the following general formula (1),

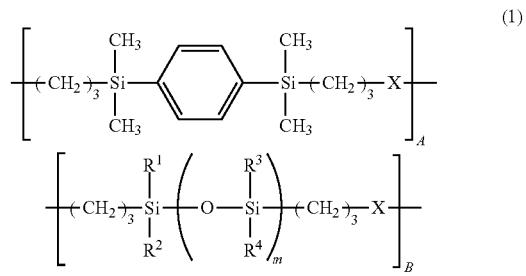

wherein, $R^1$ to $R^4$ may be the same or different, and represent a monovalent hydrocarbon group having 1 to 8 carbon atoms; "m" represents an integer of 1 to 100;

A represents a positive number; B represents 0 or a positive number; A+B=1; and X represents a divalent organic group represented by the following general formula (3),

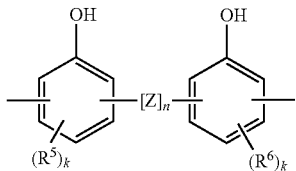
(3)

wherein, Z represents a divalent organic group selected from any of

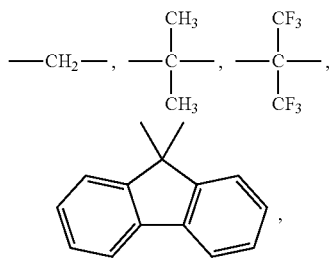

"n" represents 0 or 1; $R^5$ and $R^6$ each represent an alkyl or alkoxy group having 1 to 4 carbon atoms, and may be the same or different from each other; and "k" represents any one of 0, 1, and 2, or an epoxy-containing silicone polymer compound which has a weight average molecular weight of 3,000 to 500,000 and a repeating unit represented by the following general formula (2),

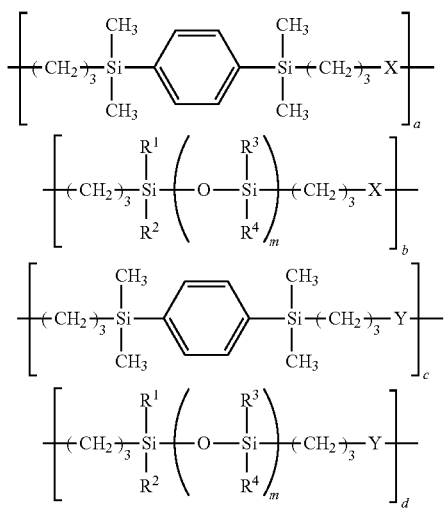
(2)

wherein, $R^1$ to $R^4$ may be the same or different, and represent a monovalent hydrocarbon group having 1 to 8 carbon atoms; "m" is an integer of 1 to 100; "a", "b", "c" and "d" each are 0 or a positive number; and a+b+c+d=1, provided that "c" and "d" are not equal to 0 at the same time, and 0<(c+d)/(a+b+c+d)≤1.0; X represents a divalent organic group represented by the following general formula (3),

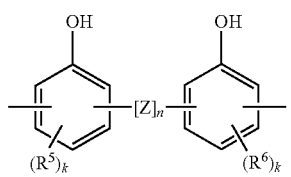
(3)

wherein, Z represents a divalent organic group selected from any of

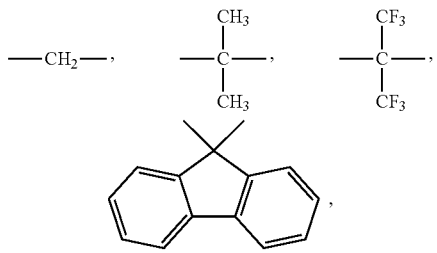

"n" represents 0 or 1; $R^5$ and $R^6$ each represent an alkyl or alkoxy group having 1 to 4 carbon atoms, and may be the same or different from each other; and "k" represents any one of 0, 1, and 2, and Y represents a divalent organic group represents by the following general formula (4),

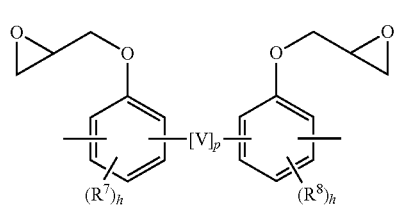
(4)

wherein, V represents a divalent organic group selected from any of

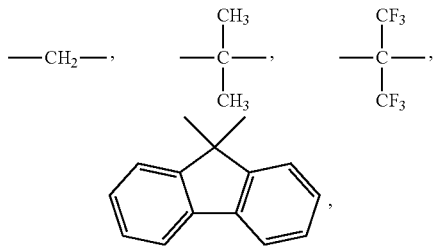

"p" represents 0 or 1; $R^7$ and $R^8$ each represent an alkyl or alkoxy group having 1 to 4 carbon atoms, and may be the same or different from each other; and "h" represents any one of 0, 1, and 2.

3. The temporary adhesive material for a wafer according to claim 2, wherein the photo base generator in the polymer layer (A) is represented by the following general formula (6),

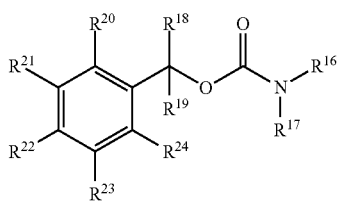
(6)

wherein, $R^{16}$ and $R^{17}$ independently represent a hydrogen atom or an organic group, or $R^{16}$ and $R^{17}$ may be bonded to each other to form a nitrogen-containing aliphatic ring or a nitrogen-containing aromatic ring which has 3 to 8 carbon atoms and may have a substituent and a heteroatom, together with a nitrogen atom to which they are bonded; $R^{18}$ and $R^{19}$ each independently represent a hydrogen atom, a halogen atom, a hydroxy group, a mercapto group, a nitro group, a silyl group, a silanol group, or an organic group; $R^{20}$, $R^{21}$, $R^{22}$, $R^{23}$, and $R^{24}$ each independently represent a hydrogen atom, a halogen atom, a hydroxy group, a mercapto group, a sulfide group, a silyl group, a silanol group, a nitro group, a nitroso group, a sulfino group, a sulfo group, a sulphonato group, a phosphino group, a phosphinyl group, a phosphono group, a phosphonato group, an amino group, an ammonio group, or an organic group, and may be the same or different, or two or more of $R^{20}$, $R^{21}$, $R^{22}$, $R^{23}$, and $R^{24}$ may be bonded to each other to form a cyclic structure or have a bond to a heteroatom.

4. The temporary adhesive material for a wafer according to claim 1, wherein the polymer layer (A) is a cured layer of a composition containing a thermosetting modified siloxane polymer including a silphenylene-containing polymer compound which has a weight average molecular weight of 3,000 to 500,000 and a repeating unit represented by the following general formula (1),

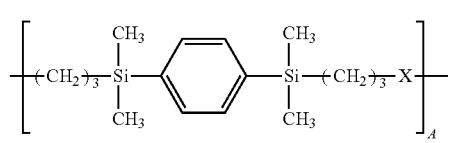
(1)

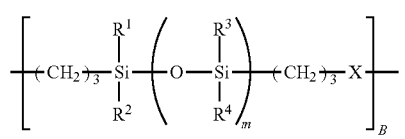

wherein, $R^1$ to $R^4$ may be the same or different, and represent a monovalent hydrocarbon group having 1 to 8 carbon atoms; "m" represents an integer of 1 to 100; A represents a positive number; B represents 0 or a positive number; A+B=1; and X represents a divalent organic group represented by the following general formula (3),

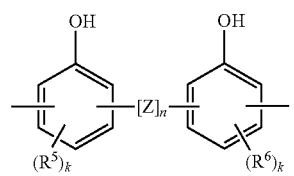
(3)

wherein, Z represents a divalent organic group selected from any of

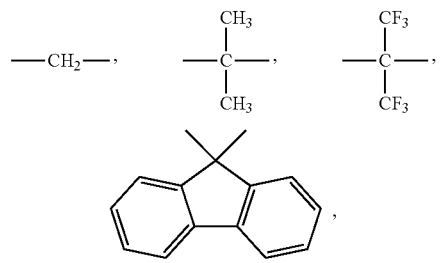

"n" represents 0 or 1; $R^5$ and $R^6$ each represent an alkyl or alkoxy group having 1 to 4 carbon atoms, and may be the same or different from each other; and "k" represents any one of 0, 1, and 2, or an epoxy-containing silicone polymer compound which has a weight average molecular weight of 3,000 to 500,000 and a repeating unit represented by the following general formula (2),

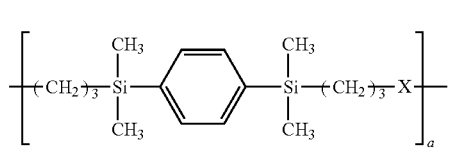
(2)

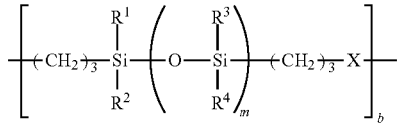

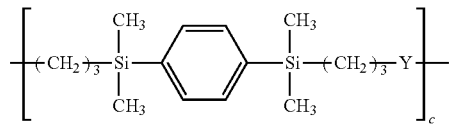

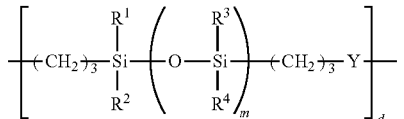

wherein, $R^1$ to $R^4$ may be the same or different, and represent a monovalent hydrocarbon group having 1 to 8 carbon atoms; "m" is an integer of 1 to 100; "a", "b", "c" and "d" each are 0 or a positive number; and a+b+c+d=1, provided that "c" and "d" are not equal to 0 at the same time, and 0<(c+d)/(a+b+c+d)≤1.0; X represents a divalent organic group represented by the following general formula (3),

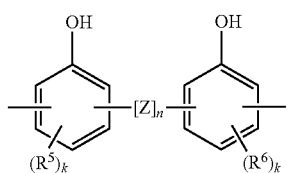
(3)

wherein, Z represents a divalent organic group selected from any of

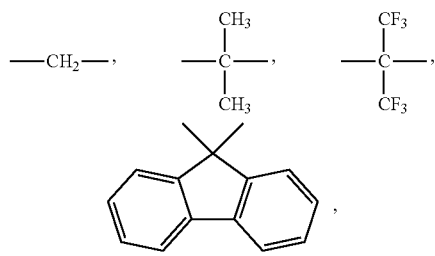

"n" represents 0 or 1; $R^5$ and $R^6$ each represent an alkyl or alkoxy group having 1 to 4 carbon atoms, and may be the same or different from each other; and "k" represents any one of 0, 1, and 2, and Y represents a divalent organic group represents by the following general formula (4),

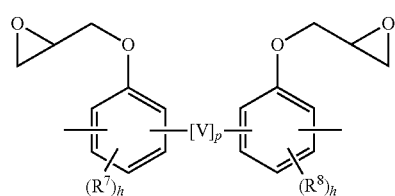
(4)

wherein, V represents a divalent organic group selected from any of

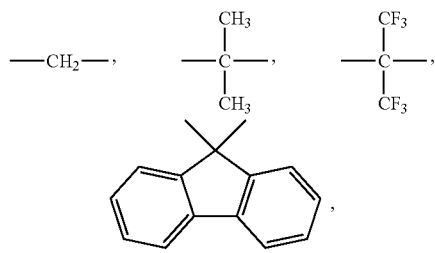

"p" represents 0 or 1; $R^7$ and $R^8$ each represent an alkyl or alkoxy group having 1 to 4 carbon atoms, and may be the same or different from each other; and "h" represents any one of 0, 1, and 2,
a photo base generator, further a thermal acid generator, and any one or more cross-linking agents selected from a phenol compound having two or more methylol groups or alkoxymethylol groups on average per molecule, or an epoxy compound having two or more epoxy groups on average per molecule.

5. The temporary adhesive material for a wafer according to claim 4, wherein the photo base generator in the polymer layer (A) is represented by the following general formula (6),

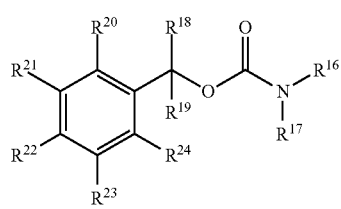
(6)

wherein, $R^{16}$ and $R^{17}$ independently represent a hydrogen atom or an organic group, or $R^{16}$ and $R^{17}$ may be bonded to each other to form a nitrogen-containing aliphatic ring or a nitrogen-containing aromatic ring which has 3 to 8 carbon atoms and may have a substituent and a heteroatom, together with a nitrogen atom to which they are bonded; $R^{18}$ and $R^{19}$ each independently represent a hydrogen atom, a halogen atom, a hydroxy group, a mercapto group, a nitro group, a silyl group, a silanol group, or an organic group; $R^{20}$, $R^{21}$, $R^{22}$, $R^{23}$, and $R^{24}$ each independently represent a hydrogen atom, a halogen atom, a hydroxy group, a mercapto group, a sulfide group, a silyl group, a silanol group, a nitro group, a nitroso group, a sulfino group, a sulfo group, a sulphonato group, a phosphino group, a phosphinyl group, a phosphono group, a phosphonato group, an amino group, an ammonio group, or an organic group, and may be the same or different, or two or more of $R^{20}$, $R^{21}$, $R^{22}$, $R^{23}$, and $R^{24}$ may be bonded to each other to form a cyclic structure or have a bond to a heteroatom.

6. The temporary adhesive material for a wafer according to claim 1, wherein the photo base generator in the polymer layer (A) is represented by the following general formula (6),

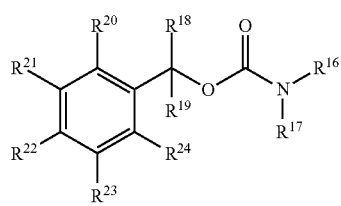
(6)

wherein, $R^{16}$ and $R^{17}$ independently represent a hydrogen atom or an organic group, or $R^{16}$ and $R^{17}$ may be bonded to each other to form a nitrogen-containing aliphatic ring or a nitrogen-containing aromatic ring which has 3 to 8 carbon atoms and may have a substituent and a heteroatom, together with a nitrogen atom to which they are bonded; $R^{18}$ and $R^{19}$ each independently represent a hydrogen atom, a halogen atom, a hydroxy group, a mercapto group, a nitro group, a silyl group, a silanol group, or an organic group; $R^{20}$, $R^{21}$, $R^{22}$, $R^{23}$, and $R^{24}$ each independently represent a hydrogen atom, a halogen atom, a hydroxy group, a mercapto group, a sulfide group, a silyl group, a silanol group, a nitro group, a nitroso group, a sulfino group, a sulfo group, a sulphonato group, a phosphino group, a phosphinyl group, a phosphono group, a phosphonato group, an amino group, an ammonio group, or an organic group, and may be the same or different, or two or more of $R^{20}$, $R^{21}$, $R^{22}$, $R^{23}$, and $R^{24}$ may be bonded to each other to form a cyclic structure or have a bond to a heteroatom.

7. A film for temporary adhesion comprising a temporary adhesive layer made of the temporary adhesive material for a wafer according to claim 1.

8. A method for producing a thin wafer comprising:
   (a) a step of bonding a surface with a circuit of a wafer which has the surface with a circuit as the front surface and a surface without a circuit as the back surface to a support via the temporary adhesive layer included in the film for temporary adhesion according to claim 7;
   (b) a step of grinding or polishing the surface without a circuit of the wafer bonded to the support;
   (c) a step of processing the surface without a circuit of the wafer;
   (d) a step of delaminating the processed wafer from the support by light irradiation; and
   (e) a step of removing the temporary adhesive material remaining on the surface with a circuit of the delaminated wafer.

9. A wafer processing laminate comprising a support, a temporary adhesive layer which comprises the temporary adhesive material for a wafer according to claim 1 formed thereon, and a wafer laminated on the temporary adhesive layer, where the wafer has a circuit-forming front surface and a back surface to be processed,
   wherein the first temporary adhesive layer releasably adheres to the support, and
   the second temporary adhesive layer releasably adheres to the front surface of the wafer.

10. A method for producing a thin wafer comprising:
    (a) a step of bonding a surface with a circuit of a wafer which has the surface with a circuit as the front surface and a surface without a circuit as the back surface to a support via the temporary adhesive material for a wafer according to claim 1;
    (b) a step of grinding or polishing the surface without a circuit of the wafer bonded to the support;
    (c) a step of processing the surface without a circuit of the wafer;
    (d) a step of delaminating the processed wafer from the support by light irradiation; and
    (e) a step of removing the temporary adhesive material remaining on the surface with a circuit of the delaminated wafer.

11. A temporary adhesive material for a wafer comprising a first temporary adhesive layer of a silicone-containing polymer layer (A) containing a photo base generator and a second temporary adhesive layer of a silicone-containing polymer layer (B) which is laminated on the first temporary adhesive layer, does not contain the photo base generator, and is different from the polymer layer (A), wherein the polymer in the polymer layer (B) is organopolysiloxane which is obtained by a hydrosilylation reaction between an alkenyl group-containing organopolysiloxane (B') which is a non-aromatic saturated hydrocarbon group-containing organopolysiloxane containing the following units (I) to (III):
    (I) a siloxane unit represented by $R^9SiO_{3/2}$ (T unit): 50 to 99 mol %;
    (II) a siloxane unit represented by $R^{10}R^{11}SiO_{2/2}$ (D unit): 0 to 49 mol %; and
    (III) a siloxane unit represented by $R^{12}{}_3SiO_{1/2}$ (M unit): 1 to 15 mol %,
    wherein, $R^9$ to $R^{12}$ represent a monovalent organic group, 50 to 80 mol % of all the organic groups represented by $R^9$ to $R^{11}$ represent the same or different non-aromatic saturated hydrocarbon groups having the following cyclic structures having 5 to 7 carbon atoms,

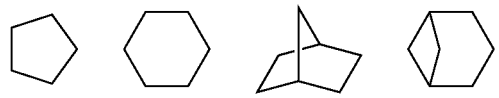

10 to 40 mol % of the organic groups represent the same or different substituted or unsubstituted monovalent acyclic saturated hydrocarbon groups having 6 to 15 carbon atoms, and groups other than the cyclic and acyclic saturated hydrocarbon groups in all the organic groups represented by $R^9$ to $R^{12}$ represent the same or different substituted or unsubstituted monovalent hydrocarbon groups having 1 to 5 carbon atoms, the alkenyl group-containing organopolysiloxane (B') in which 2 to 10 mol % of all the organic groups represented by $R^9$ to $R^{12}$ are alkenyl groups having 2 to 7 carbon atoms, and an organohydrogenpolysiloxane in such an amount that the total amount of SiH groups is 0.4 to 1.0 times larger than the total amount of alkenyl groups in the alkenyl group-containing organopolysiloxane (B'), wherein the organohydrogenpolysiloxane is represented by the following general formula (5),

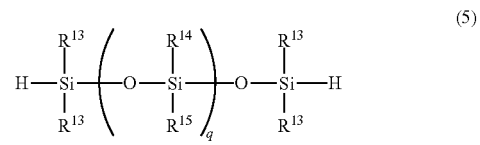

wherein, $R^{13}$ to $R^{15}$ may be the same or different, and represent a monovalent hydrocarbon group having 1 to 12 carbon atoms other than an alkenyl group; and "q" represents an integer of 0 to 100; provided that two or more kinds of different organohydrogenpolysiloxanes may be used, in the presence of a platinum group metal-based catalyst.

12. The temporary adhesive material for a wafer according to claim 11, wherein the photo base generator in the polymer layer (A) is represented by the following general formula (6),

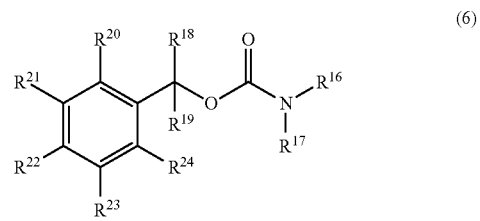

wherein, $R^{16}$ and $R^{17}$ independently represent a hydrogen atom or an organic group, or $R^{16}$ and $R^{17}$ may be bonded to each other to form a nitrogen-containing aliphatic ring or a nitrogen-containing aromatic ring which has 3 to 8 carbon atoms and may have a substituent and a heteroatom, together with a nitrogen atom to which they are bonded; $R^{18}$ and $R^{19}$ each independently represent a hydrogen atom, a halogen atom, a hydroxy group, a mercapto group, a nitro group, a silyl group, a silanol group, or an organic group; $R^{20}$, $R^{21}$, $R^{22}$, $R^{23}$, and $R^{24}$ each independently represent a hydrogen atom, a halogen atom, a hydroxy group, a mercapto group, a sulfide group, a silyl group, a silanol group, a nitro group, a nitroso group, a sulfino group, a sulfo group, a sulphonato group, a phosphino group, a phosphinyl group, a phosphono group, a phosphonato group, an amino group, an ammonio group, or an organic group, and may be the same or different, or two or more of $R^{20}$, $R^{21}$, $R^{22}$, $R^{23}$, and $R^{24}$ may be bonded to each other to form a cyclic structure or have a bond to a heteroatom.

13. The temporary adhesive material for a wafer according to claim 11, wherein the polymer layer (A) contains a thermosetting modified siloxane polymer including a silphenylene-containing polymer compound which has a weight average molecular weight of 3,000 to 500,000 and a repeating unit represented by the following general formula (1),

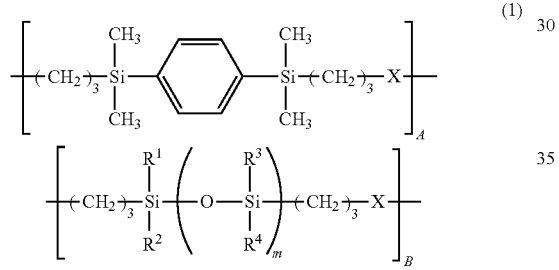

wherein, $R^1$ to $R^4$ may be the same or different, and represent a monovalent hydrocarbon group having 1 to 8 carbon atoms; "m" represents an integer of 1 to 100; A represents a positive number; B represents 0 or a positive number; A+B=1; and X represents a divalent organic group represented by the following general formula (3),

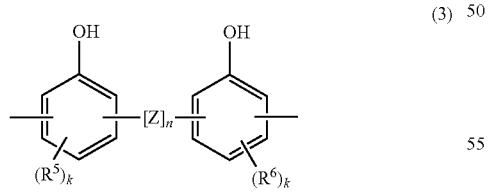

wherein, Z represents a divalent organic group selected from any of

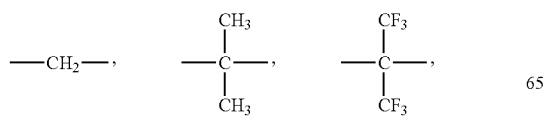

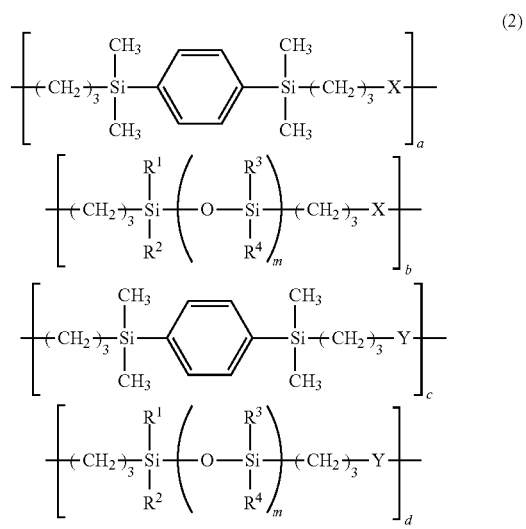

"n" represents 0 or 1; $R^5$ and $R^6$ each represent an alkyl or alkoxy group having 1 to 4 carbon atoms, and may be the same or different from each other; and "k" represents any one of 0, 1, and 2, or an epoxy-containing silicone polymer compound which has a weight average molecular weight of 3,000 to 500,000 and a repeating unit represented by the following general formula (2), wherein, $R^1$ to $R^4$ may be the same or different, and represent a monovalent hydrocarbon group having 1 to 8 carbon atoms; "m" is an integer of 1 to 100; "a", "b", "c" and "d" each are 0 or a positive number; and a+b+c+d=1, provided that "c" and "d" are not equal to 0 at the same time, and 0<(c+d)/(a+b+c+d)≤1.0; X represents a divalent organic group represented by the following general formula (3),

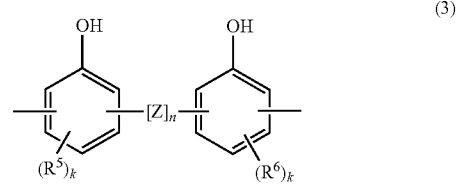

wherein, Z represents a divalent organic group selected from any of

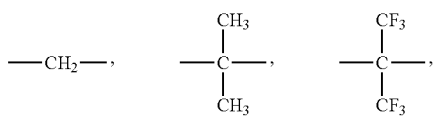

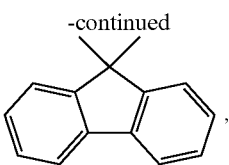

"n" represents 0 or 1; $R^5$ and $R^6$ each represent an alkyl or alkoxy group having 1 to 4 carbon atoms, and may be the same or different from each other; and "k" represents any one of 0, 1, and 2, and Y represents a divalent organic group represents by the following general formula (4),

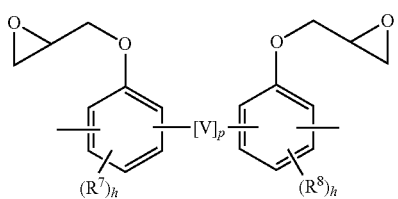

wherein, V represents a divalent organic group selected from any of

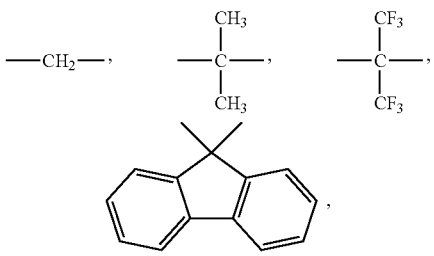

"p" represents 0 or 1; $R^7$ and $R^8$ each represent an alkyl or alkoxy group having 1 to 4 carbon atoms, and may be the same or different from each other; and "h" represents any one of 0, 1, and 2.

14. The temporary adhesive material for a wafer according to claim 13, wherein the photo base generator in the polymer layer (A) is represented by the following general formula (6),

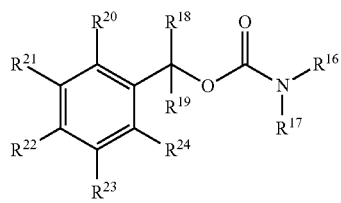

wherein, $R^{16}$ and $R^{17}$ independently represent a hydrogen atom or an organic group, or $R^{16}$ and $R^{17}$ may be bonded to each other to form a nitrogen-containing aliphatic ring or a nitrogen-containing aromatic ring which has 3 to 8 carbon atoms and may have a substituent and a heteroatom, together with a nitrogen atom to which they are bonded; $R^{18}$ and $R^{19}$ each independently represent a hydrogen atom, a halogen atom, a hydroxy group, a mercapto group, a nitro group, a silyl group, a silanol group, or an organic group; $R^{20}$, $R^{21}$, $R^{22}$, $R^{23}$, and $R^{24}$ each independently represent a hydrogen atom, a halogen atom, a hydroxy group, a mercapto group, a sulfide group, a silyl group, a silanol group, a nitro group, a nitroso group, a sulfino group, a sulfo group, a sulphonato group, a phosphino group, a phosphinyl group, a phosphono group, a phosphonato group, an amino group, an ammonio group, or an organic group, and may be the same or different, or two or more of $R^{20}$, $R^{21}$, $R^{22}$, $R^{23}$, and $R^{24}$ may be bonded to each other to form a cyclic structure or have a bond to a heteroatom.

15. The temporary adhesive material for a wafer according to claim 11, wherein the polymer layer (A) is a cured layer of a composition containing a thermosetting modified siloxane polymer including a silphenylene-containing polymer compound which has a weight average molecular weight of 3,000 to 500,000 and a repeating unit represented by the following general formula (1),

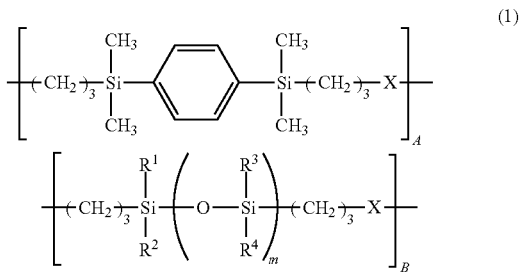

wherein, $R^1$ to $R^4$ may be the same or different, and represent a monovalent hydrocarbon group having 1 to 8 carbon atoms; "m" represents an integer of 1 to 100; A represents a positive number; B represents 0 or a positive number; A+B=1; and X represents a divalent organic group represented by the following general formula (3),

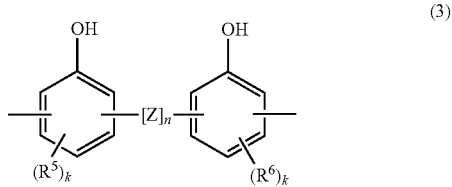

wherein, Z represents a divalent organic group selected from any of

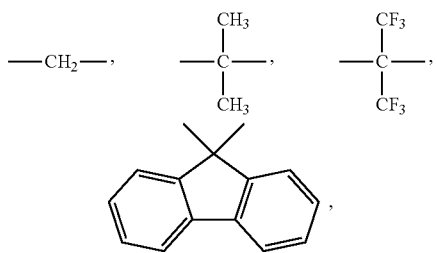

"n" represents 0 or 1; $R^5$ and $R^6$ each represent an alkyl or alkoxy group having 1 to 4 carbon atoms, and may be the same or different from each other; and "k" represents any one of 0, 1, and 2, or an epoxy-containing silicone polymer compound which has a weight average molecular weight of 3,000 to 500,000 and a repeating unit represented by the following general formula (2),

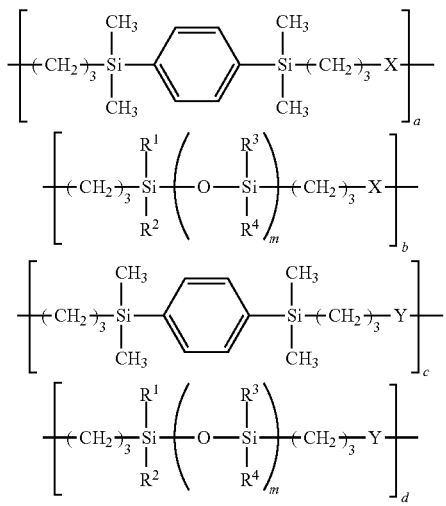

(2)

wherein, $R^1$ to $R^4$ may be the same or different, and represent a monovalent hydrocarbon group having 1 to 8 carbon atoms; "m" is an integer of 1 to 100; "a", "b", "c" and "d" each are 0 or a positive number; and a+b+c+d=1, provided that "c" and "d" are not equal to 0 at the same time, and 0<(c+d)/(a+b+c+d)≤1.0; X represents a divalent organic group represented by the following general formula (3),

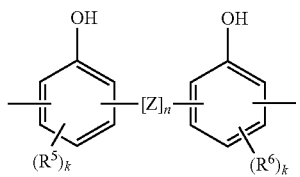

(3)

wherein, Z represents a divalent organic group selected from any of

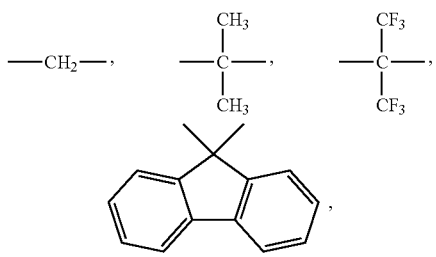

"n" represents 0 or 1; $R^5$ and $R^6$ each represent an alkyl or alkoxy group having 1 to 4 carbon atoms, and may be the same or different from each other; and "k" represents any one of 0, 1, and 2, and Y represents a divalent organic group represents by the following general formula (4),

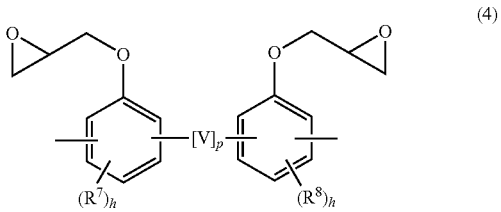

(4)

wherein, V represents a divalent organic group selected from any of

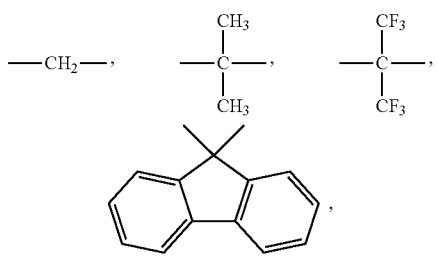

"p" represents 0 or 1; $R^7$ and $R^8$ each represent an alkyl or alkoxy group having 1 to 4 carbon atoms, and may be the same or different from each other; and "h" represents any one of 0, 1, and 2, a photo base generator, further a thermal acid generator, and any one or more cross-linking agents selected from a phenol compound having two or more methylol groups or alkoxymethylol groups on average per molecule, or an epoxy compound having two or more epoxy groups on average per molecule.

16. The temporary adhesive material for a wafer according to claim 15, wherein the photo base generator in the polymer layer (A) is represented by the following general formula (6),

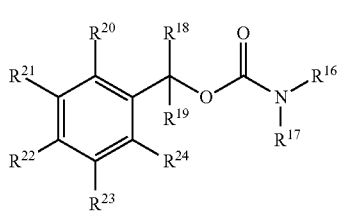

(6)

wherein, $R^{16}$ and $R^{17}$ independently represent a hydrogen atom or an organic group, or $R^{16}$ and $R^{17}$ may be bonded to each other to form a nitrogen-containing aliphatic ring or a nitrogen-containing aromatic ring which has 3 to 8 carbon atoms and may have a substituent and a heteroatom, together with a nitrogen atom to which they are bonded; $R^{18}$ and $R^{19}$ each independently represent a hydrogen atom, a halogen atom, a hydroxy group, a mercapto group, a nitro group, a silyl group, a silanol group, or an organic group; $R^{20}$, $R^{21}$, $R^{22}$, $R^{23}$, and $R^{24}$ each independently represent a hydrogen atom, a halogen atom, a hydroxy group, a mercapto group, a sulfide group, a silyl group, a silanol group, a nitro group, a nitroso group, a sulfino group, a sulfo group, a sulphonato group, a phosphino group, a phosphinyl group, a phosphono group, a phosphonato group, an amino group, an ammonio group, or an organic group, and may be the same or different, or two or more of $R^{20}$, $R^{21}$, $R^{22}$, $R^{23}$, and $R^{24}$ may be bonded to each other to form a cyclic structure or have a bond to a heteroatom.

17. A film for temporary adhesion comprising a temporary adhesive layer made of the temporary adhesive material for a wafer according to claim 11.

18. A method for producing a thin wafer comprising:
   (a) a step of bonding a surface with a circuit of a wafer which has the surface with a circuit as the front surface and a surface without a circuit as the back surface to a support via the temporary adhesive layer included in the film for temporary adhesion according to claim 17;
   (b) a step of grinding or polishing the surface without a circuit of the wafer bonded to the support;
   (c) a step of processing the surface without a circuit of the wafer;
   (d) a step of delaminating the processed wafer from the support by light irradiation; and
   (e) a step of removing the temporary adhesive material remaining on the surface with a circuit of the delaminated wafer.

19. A wafer processing laminate comprising a support, a temporary adhesive layer which comprises the temporary adhesive material for a wafer according to claim 11 formed thereon, and a wafer laminated on the temporary adhesive layer, where the wafer has a circuit-forming front surface and a back surface to be processed,
   wherein the first temporary adhesive layer releasably adheres to the support, and
   the second temporary adhesive layer releasably adheres to the front surface of the wafer.

20. A method for producing a thin wafer comprising:
   (a) a step of bonding a surface with a circuit of a wafer which has the surface with a circuit as the front surface and a surface without a circuit as the back surface to a support via the temporary adhesive material for a wafer according to claim 11;
   (b) a step of grinding or polishing the surface without a circuit of the wafer bonded to the support;
   (c) a step of processing the surface without a circuit of the wafer;
   (d) a step of delaminating the processed wafer from the support by light irradiation; and
   (e) a step of removing the temporary adhesive material remaining on the surface with a circuit of the delaminated wafer.

* * * * *